US009257494B2

(12) United States Patent
Park et al.

(10) Patent No.: US 9,257,494 B2
(45) Date of Patent: Feb. 9, 2016

(54) ORGANIC LIGHT-EMITTING DISPLAY APPARATUS

(71) Applicant: Samsung Display Co., Ltd., Yongin, Gyeonggi-Do (KR)

(72) Inventors: Jong-Hyun Park, Yongin (KR); Sun Park, Yongin (KR); Chun-Gi You, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 80 days.

(21) Appl. No.: 14/090,536

(22) Filed: Nov. 26, 2013

(65) Prior Publication Data

US 2014/0353619 A1 Dec. 4, 2014

(30) Foreign Application Priority Data

May 30, 2013 (KR) .......................... 10-2013-0062115

(51) Int. Cl.
*H01L 33/00* (2010.01)
*H01L 27/32* (2006.01)
*H01L 27/12* (2006.01)

(52) U.S. Cl.
CPC .......... *H01L 27/3276* (2013.01); *H01L 27/124* (2013.01); *H01L 27/1255* (2013.01)

(58) Field of Classification Search
CPC . H01L 27/124; H01L 27/1255; H01L 27/326; H01L 27/3276; H01L 29/786; H01L 51/50; H01L 51/5206
USPC ......... 257/12–13, 40, 81, 84, 87–89, 98–100, 257/347–348, 433–434, 501, 503, 506–507
See application file for complete search history.

(56) References Cited

U.S. PATENT DOCUMENTS

| 6,599,767 | B1 | 7/2003 | Li |
| 7,176,620 | B2 | 2/2007 | Tsujimura et al. |
| 8,106,402 | B2 * | 1/2012 | Yeo et al. ........................ 257/72 |
| 2006/0081845 | A1 | 4/2006 | Bae |
| 2012/0146030 | A1 | 6/2012 | You et al. |
| 2013/0126882 | A1 | 5/2013 | You et al. |

FOREIGN PATENT DOCUMENTS

| JP | 2004-119210 | 4/2004 |
| KR | 10-2005-0112034 | 11/2005 |
| KR | 10-2006-0033240 | 4/2006 |
| KR | 10-2012-0066492 | 6/2012 |
| KR | 10-2013-0055446 | 5/2013 |

* cited by examiner

*Primary Examiner* — Dung Le
(74) *Attorney, Agent, or Firm* — Robert E. Bushnell, Esq.

(57) ABSTRACT

An organic light-emitting display apparatus includes a thin film transistor including an active layer, gate, source and drain electrodes, a first insulating layer disposed between the active layer and the gate electrode, and a second insulating layer disposed between the gate electrode and the source and drain electrodes; a pad electrode including a first pad layer disposed on the same layer as the source and drain electrodes and a second pad layer disposed on the first pad layer; a third insulating layer covering the source electrode and the drain electrode and an end portion of the pad electrode; a pixel electrode including a semi-transmissive metal layer and disposed in an opening formed in the third insulating layer; and a fourth insulating layer having an opening formed in a location corresponding to an opening formed in the third insulating layer and covering the end portion of the pixel electrode.

24 Claims, 14 Drawing Sheets

ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on 30 May 2013 and there duly assigned Serial No. 10-2013-0062115.

BACKGROUND OF THE INVENTION

1. Field of the Invention

Embodiments of the present invention relate to an organic light-emitting display apparatus and a method of manufacturing the same.

2. Description of the Related Art

An organic light-emitting diode (OLED) display apparatus generally includes a hole injection electrode, an electron injection electrode, and an organic light-emitting layer formed therebetween. The OLED display apparatus is a self light-emitting display apparatus that emits light when holes injected from the hole injection electrode and electrons injected from the electron injection electrode recombine in the organic light-emitting layer to en excited state that gradually disappears thereafter.

Because of its high quality characteristics, such as low power consumption, high brightness, and fast response speed, the OLED display apparatus has received attention as a next generation display apparatus.

SUMMARY OF THE INVENTION

The present invention provides an organic light-emitting display apparatus having an excellent display quality and a method of manufacturing the same.

According to an aspect of the present invention, there is provided an organic light-emitting display apparatus including a thin film transistor having an active layer, a gate electrode, a source electrode, a drain electrode, a first insulating layer disposed between the active layer and the gate electrode, and a second insulating layer disposed between the gate electrode and the source electrode and the drain electrode; a pad electrode including a first pad layer disposed on the same layer as the source electrode and the drain electrode and a second pad layer disposed on the first pad layer; a third insulating layer covering the source electrode and the drain electrode and an end portion of the pad electrode; a pixel electrode including a semi-transmissive metal layer and disposed in an opening formed in the third insulating layer; a fourth insulating layer having an opening formed in a location corresponding to an opening formed in the third insulating layer and covering an end portion of the pixel electrode; an organic emission layer disposed on the pixel electrode; and an opposing electrode disposed on the organic emission layer.

The source electrode and the drain electrode have a stack structure of a plurality of heterogeneous metal layers having different electron mobility.

The source electrode and the drain electrode include a layer including molybdenum and a layer including aluminum.

A capacitor includes a first electrode disposed on the same layer as the active layer and a second electrode disposed on the same layer as the gate electrode.

The first electrode of the capacitor includes a semiconductor material doped with ion impurities.

The second electrode of the capacitor includes a transparent conductive oxide.

The capacitor further includes a third electrode disposed on the same layer as the source electrode and the drain electrode.

The first pad layer includes the same material as those of the source electrode and the drain electrode.

The first pad layer includes a layer including molybdenum and a layer including aluminum.

The second pad layer includes a transparent conductive oxide.

The semi-transmissive metal layer includes sliver (Ag) or a silver alloy.

A protection layer is further stacked on the semi-transmissive metal layer.

The protection layer includes a transparent conductive oxide.

The third insulating layer is an organic insulating film.

The fourth insulating layer is an organic insulating film.

An opening formed in the second insulating layer, the opening formed in the third insulating layer, and the opening formed in the fourth insulating layer overlap with each other.

The opening formed in the third insulating layer is greater than the opening formed in the fourth insulating layer and smaller than the opening formed in the second insulating layer.

The end portion of the pixel electrode is disposed on a top end of the opening formed in the third insulating layer.

The organic light-emitting display apparatus further includes a cathode contact unit having a first contact layer disposed on the second insulating layer and including the same material as that of the first pad layer; and a second contact layer connected to the first contact layer through a contact hole formed in the third insulating layer, connected to the opposing electrode through a contact hole formed in the fourth insulating layer, and including the same material as that of the pixel electrode.

The organic light-emitting display apparatus further includes a pixel electrode contact unit which electrically connects the pixel electrode to one of the source electrode and the drain electrode through a contact hole formed in the third insulating layer. The pixel electrode contact unit includes a first contact layer including the same material as those of the source electrode and the drain electrode; and a second contact layer including the same material as that of the second pad layer.

The pixel electrode contact unit further includes a third contact layer disposed on the first insulating layer and the second insulating layer and including the same material as that of the second electrode, the first contact layer is electrically connected to the third contact layer through a contact hole formed in the second insulating layer.

An end portion of the third contact layer protrudes from an etching surface of an opening formed in the second insulating layer and directly contacts the pixel electrode.

An end portion of the third contact layer protrudes from an etching surface of an opening formed in the third insulating layer and directly contacts the pixel electrode.

The pixel electrode contact unit further includes a fourth contact layer disposed between the first insulating layer and the third insulating layer and including the same material as that of the gate electrode.

The opposing electrode has a reflective metal layer.

According to another aspect of the present invention, there is provided a method of manufacturing an organic light-emitting display apparatus, including steps of forming a semiconductor layer on a substrate, patterning the semiconductor layer, and forming an active layer of a thin film transistor and a first electrode of a capacitor; forming a first insulating layer, forming a transparent conductive oxide layer on the first insulating layer, patterning the transparent conductive oxide layer, and forming a second electrode of the capacitor; forming a first metal layer, pattering the first metal layer, and forming a gate electrode of the thin film transistor on the same layer as the second electrode; forming a second insulating layer and forming a contact hole exposing a part of the active layer in the second insulating layer and a first opening in an area spaced apart from a side surface of the active layer; forming a second metal layer, pattering the second metal layer, and forming a source electrode, a drain electrode, and a first pad layer of a pad electrode; forming a transparent conductive oxide layer, patterning the transparent conductive oxide layer, and forming a second pad layer on the first pad layer; forming a third insulating layer as an organic insulating film and forming a second opening in an area overlapping with the first opening and smaller than the first opening and an opening exposing a top surface of the second pad layer in the third insulating layer; forming a semi-transmissive metal layer, patterning the a semi-transmissive metal layer, and forming a pixel electrode in the second opening; forming a fourth insulating layer as an organic insulating film and forming a third opening exposing a top surface of the pixel electrode in the fourth insulating layer; forming an organic emission layer on the pixel electrode; and forming an opposing electrode on the organic emission layer.

After formation of the gate electrode, the method includes a step of simultaneously doping a source area and a drain area of the active layer and the first electrode of the capacitor with ion impurities by using one time doping process.

The second metal layer has a stack structure of a plurality of heterogeneous metal layers having different electron mobility.

A protection layer includes a transparent conducive oxide on a top surface of the semi-transmissive metal layer. The method includes a step of patterning the semi-transmissive metal layer and the protection layer.

The first metal layer, the second metal layer, the transparent conducive oxide layer, and the semi-transmissive metal layer are wet etched.

A first contact layer of a pixel contact unit is formed when the second metal layer is patterned, a second contact layer including the transparent conducive oxide forming the second pad layer is formed on the first contact layer, and a contact hole is formed when the third insulating layer is patterned.

A third contact layer is formed of the transparent conducive oxide forming the second electrode of the capacitor, a fourth contact layer is formed as the first metal layer, and a contact hole is formed in the third insulating layer to connect the fourth contact layer and the first contact layer.

An end portion of the third contact layer is formed by protruding further than etching surfaces of the first opening and the second opening.

The pixel electrode is formed to connect to both the second contact layer and the third contact layer.

A first contact layer of a cathode contact unit is formed when the second metal layer is patterned, a contact hole is formed in the third insulating layer, a second contact layer is formed in the contact hole when the pixel electrode is patterned, and an opening covering an end portion of the second contact layer is formed in the fourth insulating layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
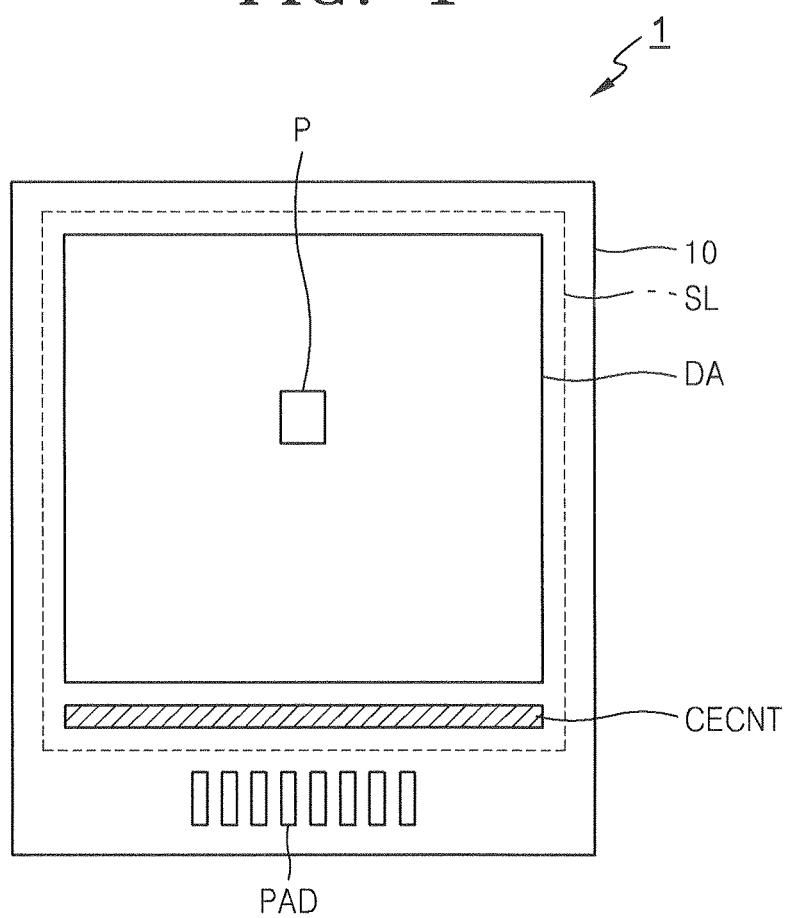
FIG. 1 is a schematic plan view illustrating an organic light-emitting display apparatus according to an embodiment of the present invention.

The present invention will now be described more fully with reference to the accompanying drawings for those of ordinary skill in the art to be able to perform the present invention without any difficulty. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art.

Also, parts in the drawings unrelated to the detailed description are omitted to ensure clarity of the present invention. Like reference numerals in the drawings denote like elements.

In various embodiments, elements having the same structure denoted by the same reference numeral are exemplarily explained in a first embodiment, and structures other than those in the first embodiment will be explained in other embodiments.

Also, sizes and thicknesses of elements in the drawings are arbitrarily shown for convenience of explanation, and thus are not limited to those as shown.

Various layers and regions are enlarged for clarity in the drawings. Thicknesses of some layers and regions are exaggerated for convenience of explanation in the drawings. It will also be understood that when a layer, film, region, or plate is referred to as being "on" another layer, film, region, or plate, it can be directly on the other layer, film, region, or plate, or intervening layers, films, regions, or plates may also be present therebetween.

Unless the context dictates otherwise, the word "comprise" or variations such as "comprises" or "comprising" is understood to mean "includes, but is not limited to" such that other elements that are not explicitly mentioned may also be included. Also, it will be understood that the term "on" encompasses orientations of both "over" and "under" without being limited to "over" in a direction of gravity. As used herein, the term "and/or" includes any and all combinations of one or more of the associated listed items. Expressions such as "at least one of," when preceding a list of elements, modify the entire list of elements and do not modify the individual elements of the list.

Figure 2:
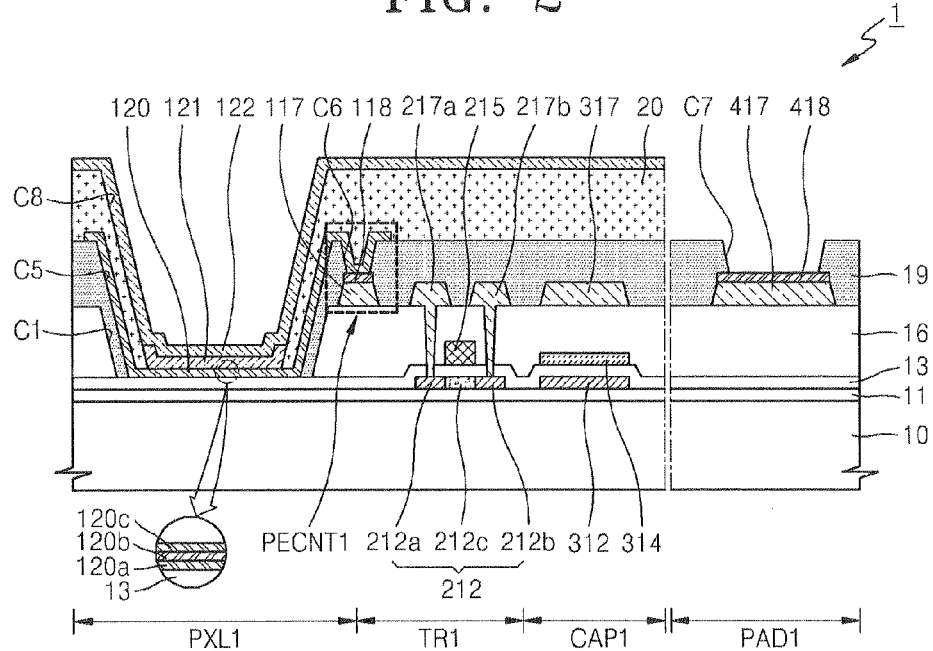
FIG. 2 is a schematic cross-sectional view illustrating a part of a pixel and a pad of an organic light-emitting display apparatus according to an embodiment of the present invention.

FIG. 1 is a schematic plan view illustrating an organic light-emitting display apparatus 1 according to an embodiment of the present invention. FIG. 2 is a schematic cross-sectional view illustrating a part of a plurality of pixels P and a plurality of pads PAD of the organic light-emitting display apparatus 1 according to an embodiment of the present invention.

In reference to FIG. 1, a display area DA that includes the plurality of pixels P and displays an image is provided on a substrate 10 of the organic light-emitting display apparatus 1 according to an embodiment of the present invention. The display area DA is formed in a sealing line SL and includes a sealing member (not shown) that seals the display area DA along the sealing line SL. A cathode contact unit CECNT for supplying power to a cathode that is commonly formed in the display area DA is formed between the display area DA and the pads PAD.

In reference to FIG. 2, a pixel area PXL1 including at least one organic emission layer 121, a transistor area TR1 including at least one thin film transistor, a capacitor area CAP1 including at least one capacitor, and a pad area PAD1 are provided on the substrate 10.

An active layer 212 of the thin film transistor provided on the substrate 10 and the buffer layer 11 is included in the transistor area TR1.

The substrate 10 may be a transparent substrate, such as a plastic substrate including polyethylene terephthalate (PET), polyethylene naphthalate (PEN), and polyimide as well as a glass substrate.

A buffer layer 11 that forms a planar surface and prevents impurity elements from penetrating into the substrate 10 may be further provided on the substrate 10. The buffer layer 11 may have a single layer structure or a multilayer structure including silicon nitride and/or silicon oxide.

The active layer 212 on the buffer layer 11 is included in the transistor area TR1. The active layer 212 may be formed of a semiconductor including amorphous silicon or crystalline silicon. The active layer 212 may include a channel area 212c, a source area 212a provided in the outside of the channel area 212c and doped with ion impurities, and a drain area 212b. The active layer 212 is not limited to amorphous silicon or crystalline silicon, and may include an oxide semiconductor.

A gate electrode 215 is provided on the active layer 212 in a location corresponding to the channel area 212c of the active layer 212 with a first insulating layer 13 that is an insulation film disposed between the gate electrode 215 and the active layer 212. The gate electrode 215 may have a single layer structure or a multilayer structure including one or more metal materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A source electrode 217a and a drain electrode 217b that are respectively connected to the source region 212a and the drain region 212b of the active layer 212 are provided on the gate electrode 215 with a second insulating layer 16 that is an interlayer insulating film between the source and drain electrodes 217a and 217b and the gate electrode 215. Each of the source electrode 217a and the drain electrode 217b may have a structure of two or more heterogeneous metal layers having different electron mobility. For example, each of the source electrode 217a and the drain electrode 217b may have a two or more layer structure including a metal material selected from the group consisting of Al, Pt, Pd, Ag, Mg, Au, Ni, Nd, Ir, Cr, Li, Ca, Mo, Ti, W, Cu, and alloys of these metal materials.

A third insulating layer 19 is provided on the second insulating layer 16 to cover the source electrode 217a and the drain electrode 217b.

The first insulating layer 13 and the second insulating layer 16 may include single layer inorganic insulating films or multilayer inorganic insulating films. The inorganic insulating films forming the first insulating layer 13 and the second insulating layer 16 may include $SiO_2$, $SiNx$, $SiON$, $Al_2O_3$, $TiO_2$, $Ta_2O_5$, $HfO_2$, $ZrO_2$, BST, PZT, and the like.

The third insulating layer 19 may include an organic insulating film. The third insulating layer 19 may include general-purpose polymers (PMMA, PS), polymer derivatives having a phenol group, acrylic polymers, imide based polymers, arylether based polymers, amide based polymers, fluorinate polymers, p-xylene based polymers, vinyl alcohol based polymers, blends of these, etc.

A fourth insulating layer 20 is provided on the third insulating layer 19. The fourth insulating layer 20 may include an organic insulating film. The fourth insulating layer 20 may include general-purpose polymers (PMMA, PS), polymer derivatives having a phenol group, acrylic polymers, imide based polymers, arylether based polymers, amide based polymers, fluorinate polymers, p-xylene based polymers, vinyl alcohol based polymers, blends of these, etc.

A pixel electrode 120 provided on the buffer layer 11 and the first insulating layer 13 is included in the pixel area PXL1.

The pixel electrode 120 is disposed in an opening C5 formed in the third insulating layer 19.

The opening C5 formed in the third insulating layer 19 is greater than an opening C8 formed in the fourth insulating layer 20 and is smaller than an opening C1 formed in the second insulating layer 16. The opening C1 formed in the second insulating layer 16, the opening C5 formed in the third insulating layer 19, and the opening C8 formed in the fourth insulating layer 20 overlap with each other.

An end portion of the pixel electrode 120 is disposed on a top end of the opening C5 formed in the third insulating layer 19 and covered by the fourth insulating layer 20. Meanwhile, a top surface of the pixel electrode 120 disposed in the opening C5 formed in the third insulating layer 19 is exposed to the opening C8 formed in the fourth insulating layer 20.

The pixel electrode 120 is connected to the pixel contact unit PECNT1 through a contact hole C6 formed in the third insulating layer 19. The pixel contact unit PECNT1 is electrically connected to one of a source electrode and a drain electrode of a driving transistor and drives the pixel electrode 120.

The pixel contact unit PECNT1 may include a first contact layer 117 including the same material as the above-described material of the source electrode 217a and the drain electrode 217b and a second contact layer 118 including a transparent conductive oxide. Although not shown in detail in FIG. 2, the first contact layer 117 is connected to a data line (not shown) that may be electrically connected to one of the source electrode and the drain electrode of the driving transistor. If a transistor of FIG. 2 is the driving transistor, the first contact layer 117 may be directly connected to the source electrode 217a or the drain electrode 217b.

The pixel electrode 120 includes a transflective metal layer 120b. The pixel electrode 120 may further include layers 120a and 120c that are respectively formed in lower and upper portions of the transflective metal layer 120b and include the transparent conductive oxide protecting the transflective metal layer 120b.

The transflective metal layer 120b may be formed of silver (Ag) or a silver alloy. The transflective metal layer 120b forms a micro cavity structure, along with an opposing electrode 122 that is a reflective electrode that will be described later, thereby increasing light efficiency of the organic light-emitting display apparatus 1.

The layers 120a and 120c including the transparent conductive oxide may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The layer 120a formed in the lower portion of the transflective metal layer 120b and including the transparent conductive oxide may reinforce adhesion between the first insulating layer that is the inorganic insulating film and the pixel electrode 120. The layer 120c formed in the upper portion of the transflective metal layer 120b and including the transparent conductive oxide may function as a barrier layer protecting the transflective metal layer 120b.

Meanwhile, if electrons are supplied to metal having a strong reduction like silver (Ag) forming the transflective metal layer 120b during an etching process for patterning the pixel electrode 120, silver (Ag) ions present in an etchant in an ion state may be problematically educed as silver (Ag) again. Such educed silver (Ag) may be a particle related defect factor causing a dark spot during a subsequent process of forming the pixel electrode 120.

When the source electrode 217a or the drain electrode 217b, the first contact layer 117 of the pixel electrode contact unit PECNT1, the first pad layer 417 of a pad electrode, or a data wiring (not shown) formed of the same material as the materials of these is exposed to the etchant during a process of etching the pixel electrode 120 including silver (Ag), silver (Ag) ions having a strong reduction may be educed as silver (Ag) again by receiving electrons from these metal materials. For example, when these metal materials include molybdenum or aluminum, silver (Ag) may be educed again by providing electrons received from molybdenum or aluminum to silver (Ag) ions again. Educed silver (Ag) particles may be particle related defect factors causing the dark spot during the subsequent process.

However, the source electrode 217a or the drain electrode 217b of the organic light-emitting display apparatus 1 according to the present embodiment is covered by the third insulating layer 19 that is the organic film, and thus the source electrode 217a or the drain electrode 217b is not exposed to the etchant including silver (Ag) ions during the process of etching the pixel electrode 120 including sliver (Ag), thereby preventing a particle related defect due to the eduction of silver (Ag).

Meanwhile, an intermediate layer (not shown) including the organic emission layer 121 is provided on the pixel electrode 120 having the top surface exposed by the opening C8 formed in the fourth insulating layer 20. The organic emission layer 121 may be formed of a low molecular weight organic material or a high molecular weight organic material. When the organic emission layer 121 is formed of the low molecular weight organic material, a hole transport layer (HTL), a hole injection layer (HIL), an electron transport layer (ETL), and an electron injection layer (EIL) may be stacked with respect to the organic emission layer 121. Various other layers may be stacked if necessary. In this case, various low molecular weight organic materials may be used including copper phthalocyanine (CuPc), N'-diphenyl-benzidine (NPB), and tris-8-hydroxyquinoline aluminum (Alq3). When the organic emission layer 121 is formed of the high molecular weight organic material, the HTL may be used in addition to the organic emission layer 121. The HTL may be formed of poly-(3,4)-ethylene-dihydroxy thiophene (PEDOT) or polyaniline (PANI). In this case, a high molecular weight organic material may include a polyphenylene vinylene (PPV)-based high molecular weight organic material and a polyfluorene-based high molecular weight organic material. An inorganic material may be further provided between the pixel electrode 120, and the opposing electrode 122.

Although the organic emission layer 121 is disposed on a floor of the opening C8 in FIG. 2, this is for convenience of description and the present invention is not limited thereto. The organic emission layer 121 may be formed on a top surface of the fourth insulating layer 20 along an etching surface of the opening C5 formed in the third insulating layer 19 as well as on the floor of the opening C8.

The opposing electrode 122 is provided on the organic emission layer 121 as a common electrode. The organic light-emitting display apparatus 1 according to the present embodiment use the pixel electrode 120 as an anode and the opposing electrode 122 as a cathode. Polarities of the electrodes may be switched.

The opposing electrode 122 may be configured as a reflective electrode including a reflective material. In this regard, the opposing electrode 122 may include one or more materials selected from the group consisting of Al, Mg, Li, Ca, LiF/Ca, and LiF/Al. The opposing electrode 122 is configured as the reflective electrode, so that light emitted from the organic emission layer 121 is reflected from the opposing electrode 122, transmits the pixel electrode 120 formed of semi-transmissive metal, and is emitted to the substrate 10.

A capacitor including a first electrode 312 disposed on the same layer as the active layer 212, a second electrode 314 disposed on the same layer as the gate electrode 215, and a third electrode 317 disposed on the same layer as the source electrode 217a and the drain electrode 217b is provided in the capacitor area CAP1 and on the substrate 10 and the buffer layer 11.

The first electrode 312 of the capacitor may be formed as a semiconductor doped with ion impurities, like the source area 212a and the drain area 212b of the active layer 212.

The second electrode 314 of the capacitor is disposed on the first insulating layer 13 in the same way as the gate electrode 215, whereas materials of the second electrode 314 and the gate electrode 215 are different from each other. The material of the second electrode 314 may include the transparent conductive oxide. The semiconductor doped with ion impurities is formed on the first electrode 312 through the second electrode 314, thereby forming the capacitor having a metal-insulator-metal (MIM) structure.

The third electrode 317 of the capacitor may be formed of the same material as those of the source electrode 217a and the drain electrode 217b. As described above, the third electrode 317 is covered by the third insulating layer 19 that is the organic film, and thus the third electrode 317 is not exposed to the etchant including silver (Ag) ions during the process of etching the pixel electrode 120 including sliver (Ag), thereby preventing the particle related defect due to the eduction of silver (Ag). The capacitor constitutes a parallel circuit including the first electrode 312, the second electrode 314, and third electrode 317, thereby increasing a capacitance of the organic light-emitting display apparatus 1 without increasing an area of the capacitor. Thus, the area of the capacitor may be reduced by the increase in the capacitance, thereby increasing an aperture ratio.

The pad area PAD1 that is an area in which pad electrodes 417 and 418 that are connection terminals of an external driver are disposed is disposed outside the display area DA.

The first pad layer 417 may have a structure of a plurality of metal layers having different electron mobility like the above-described source electrode 217a and drain electrode 217b. For example, the first pad layer 417 may have a multilayer structure including one or more metal materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

The second pad layer 418 may be formed of the transparent conductive oxide including at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The first pad layer 417 may prevent pad electrodes from being exposed to moisture and oxygen, thereby preventing the deterioration of reliability of the pad electrodes.

As described above, although the first pad layer 417 is disposed in an area exposed to the contact hole C7 formed in the third insulating layer 19, since the second pad layer 418 that is a protection layer is formed on an upper portion of the first pad layer 417, the first pad layer 417 is not exposed to the etchant during the process of etching the pixel electrode 120.

Moreover, an end portion of the first pad layer 417 that is sensitive to an external environment such as moisture or oxygen is covered by the third insulating layer 19, and thus the end portion of the first pad layer 417 is not also exposed to the etchant during the process of etching the pixel electrode 120.

Therefore, the particle related defect due to the eduction of silver (Ag) may be prevented, and the deterioration of reliability of the pad electrodes may also be prevented.

Meanwhile, although not shown in FIG. 2, the organic light-emitting display apparatus 1 according to the present embodiment may further include a sealing member (not shown) that seals the display area DA including the pixel area PXL1, the capacitor area CAP1, and the transistor area TR1. The sealing member may be formed as a sealing thin film disposed by alternating a substrate including a glass member, a metal film, or an organic insulating film, and an inorganic insulating film.

A method of manufacturing the organic light-emitting display apparatus 1 according to the present embodiment will now be described with reference to FIGS. 3A through 3I below.

FIGS. 3A through 3I are schematic cross-sectional views for explaining a method of manufacturing the organic light-emitting display apparatus 1, according to an embodiment of the present invention.

Figure 3A:
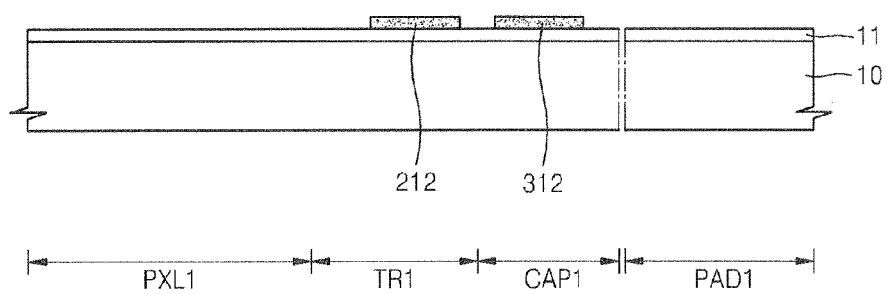
FIGS. 3A through 3I are schematic cross-sectional views for explaining a method of manufacturing the organic light-emitting display apparatus of FIG. 1, according to an embodiment of the present invention.

FIG. 3A is a schematic cross-sectional view for explaining a first mask process of the organic light-emitting display apparatus 1 according to the present embodiment of the present invention.

In reference to FIG. 3A, the buffer layer 11 is formed on the substrate 10 and a semiconductor layer (not shown) is formed on the buffer layer 11 and patterned, and thus the active layer 212 of a thin film transistor and the first electrode 312 of a capacitor are formed.

Although not shown in FIG. 3A, a photoresist (not shown) is coated on the semiconductor layer (not shown), the semiconductor layer (not shown) is patterned by using photolithography using a first photomask (not shown), and the active layer 212 and the first electrode 312 are formed. A first masking process using photolithography includes performing exposure using an exposure device (not shown) on the first mask (not shown), and performing a series of processes, such as developing, etching, stripping, and ashing.

The semiconductor layer (not shown) may include amorphous silicon or crystalline silicon. In this regard, crystalline silicon may be formed by crystallizing amorphous silicon. Amorphous silicon may be crystallized by using various methods such as rapid thermal annealing (RTA), solid phase crystallization (SPC), excimer laser annealing (ELA), metal-induced crystallization (MIC), metal-induced lateral crystallization (MILC), sequential lateral solidification (SLS), and the like. Meanwhile, the semiconductor layer (not shown) is not limited to amorphous silicon or crystalline silicon and may include an oxide semiconductor.

Figure 3B:
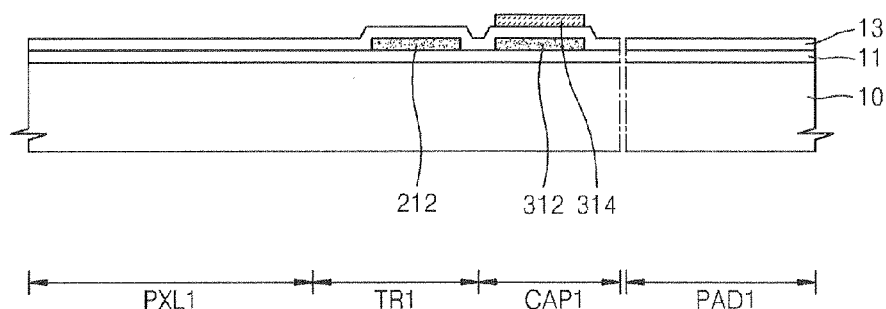

FIG. 3B is a schematic cross-sectional view for explaining a second mask process of the organic light-emitting display apparatus 1 according to the present embodiment of the present invention.

The first insulating layer 13 is formed on a resultant structure of the first mask process of FIG. 3A, a transparent conductive oxide layer (not shown) is formed on the first insulating layer 13 and then patterned.

As a result of the patterning, the second electrode 314 of the capacitor is formed on the first insulating layer 13.

Figure 3C:
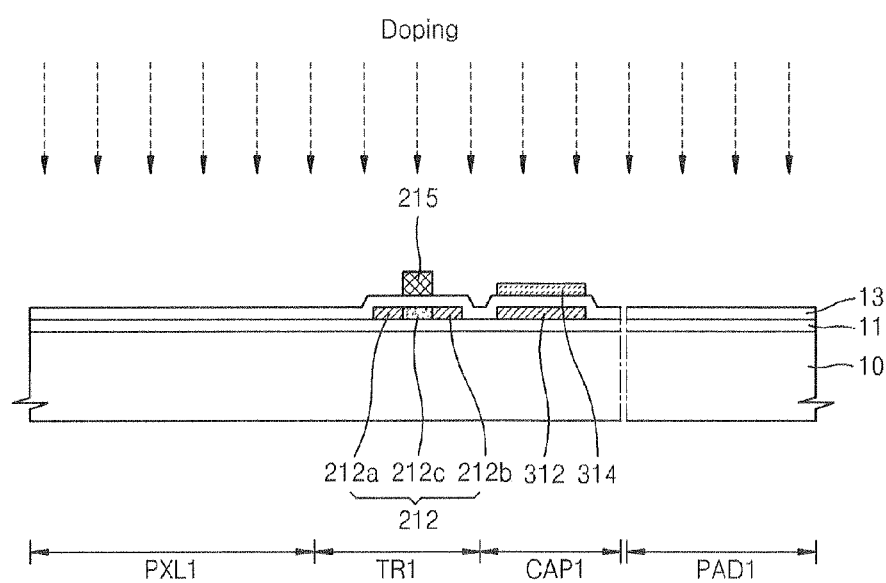

FIG. 3C is a schematic cross-sectional view for explaining a third mask process of the organic light-emitting display apparatus 1 according to the present embodiment of the present invention.

A first metal layer (not shown) is deposited on a resultant structure of the second mask process of FIG. 3B and then patterned. In this regard, as described above, the first metal layer (not shown) may be a single layer or a multilayer formed of one or more metal materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

As a result of the patterning, the gate electrode 215 is formed on the first insulating layer 13.

The above-described structure is doped with ion impurities. The active layer 212 of the thin film transistor and the first electrode 312 of the capacitor are doped with ion impurities B or P at a concentration of $1 \times 10^{15}$ atoms/cm$^2$ or more.

The active layer 212 is doped with ion impurities by using the gate electrode 215 as a self-align mask, and thus the active layer 212 includes the source area 212a and the drain area 212b doped with ion impurities and the channel area 212c disposed between the source area 212a and the drain area 212b. In this regard, the first electrode 312 of the capacitor is an electrode doped with ion impurities and forming a MIM CAP.

Therefore, the first electrode 312 of the capacitor as well as the active layer 212 are simultaneously doped by using one time doping process, thereby reducing manufacturing cost resulted from a reduction in the doping process.

Figure 3D:
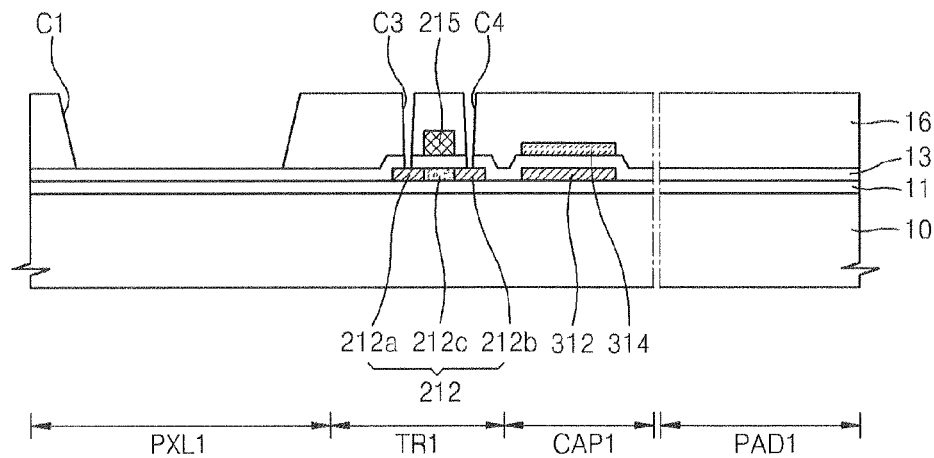

FIG. 3D is a schematic cross-sectional view for explaining a fourth mask process of the organic light-emitting display apparatus 1 according to the present embodiment of the present invention.

In reference to FIG. 3D, the second insulating layer 16 is formed on a resultant structure of the third mask process of FIG. 3C and then patterned, and thus openings C3 and C4 exposing the source area 212a and the drain area 212b of the active layer 212 and an opening C1 are formed in an area spaced apart from a side of the active layer 212 as an area in which the pixel electrode 120 is to be disposed that will be described later.

Figure 3E:
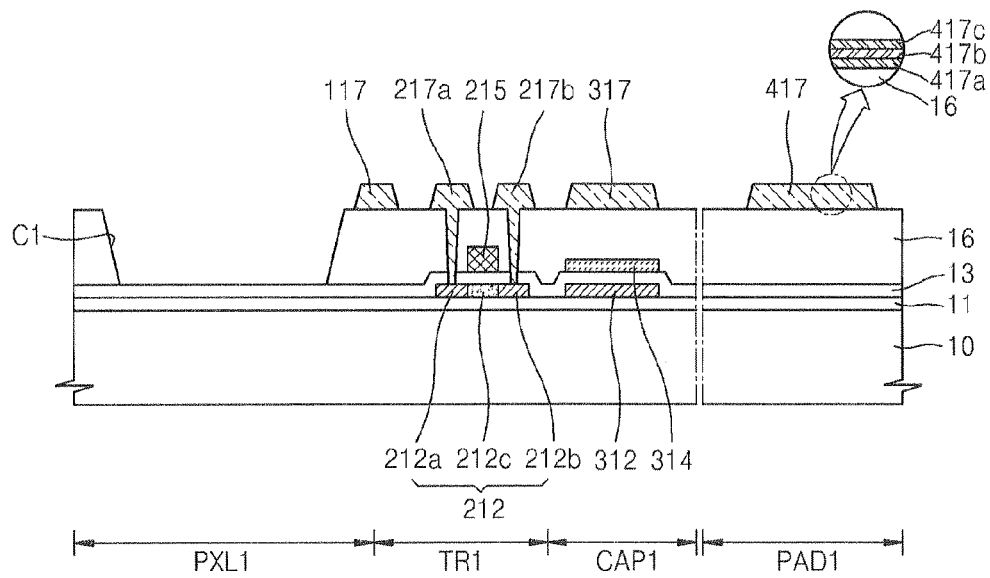

FIG. 3E is a schematic cross-sectional view for explaining a fifth mask process of the organic light-emitting display apparatus 1 according to the present embodiment of the present invention.

In reference to FIG. 3E, a second metal layer (not shown) is formed on a resultant structure of the fourth mask process of FIG. 3D and then patterned, and thus the source electrode 217a and the drain electrode 217b, the first contact layer 117 of the pixel electrode contact unit PECNT1, and the first pad layer 417 of a pad electrode are simultaneously formed.

The second metal layer (not shown) may have a structure of two or more heterogeneous metal layers having different electron mobility. For example, the second metal layer (not shown) may have a two or more layer structure including a metal material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and alloys of these metal materials.

A configuration of the first pad layer 417 is illustrated in detail for an exemplary illustration of a configuration of the second metal layer (not shown). For example, the second metal layer (not shown) of the present embodiment may include a first layer 417a including molybdenum (Mo), a second layer 417b including aluminum (Al), and a third layer 417c including molybdenum (Mo).

The second layer 417b including aluminum (Al) is a metal layer having a small resistance and excellent electrical characteristic. The first layer 417a disposed in a lower portion of the second layer 417b and including molybdenum (Mo) reinforces adhesion between the second insulating layer 16 and the second layer 417b. The third layer 417c disposed in an upper portion of the second layer 417b and including molybdenum (Mo) may function as a barrier layer preventing a heel lock of aluminum included in the second layer 417b, oxidation, and diffusion.

Meanwhile, although not shown in FIG. 3E, a data wiring may also be formed by patterning the second metal layer (not shown) during the fifth mask process.

Figure 3F:
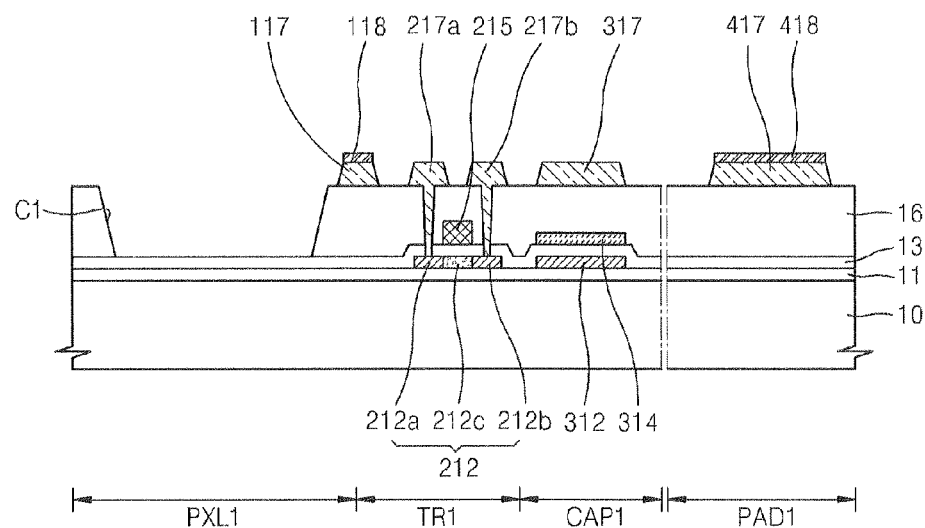

FIG. 3F is a schematic cross-sectional view for explaining a sixth mask process of the organic light-emitting display apparatus 1 according to the present embodiment of the present invention.

In reference to FIG. 3F, a transparent conductive oxide layer (not shown) is formed on a resultant structure of the fifth mask process of FIG. 3E and then patterned, and thus the second contact layer 118 of the pixel electrode contact unit PECNT1 and the second pad layer 418 of the pad electrode are simultaneously formed.

The transparent conductive oxide layer include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

Figure 3G:
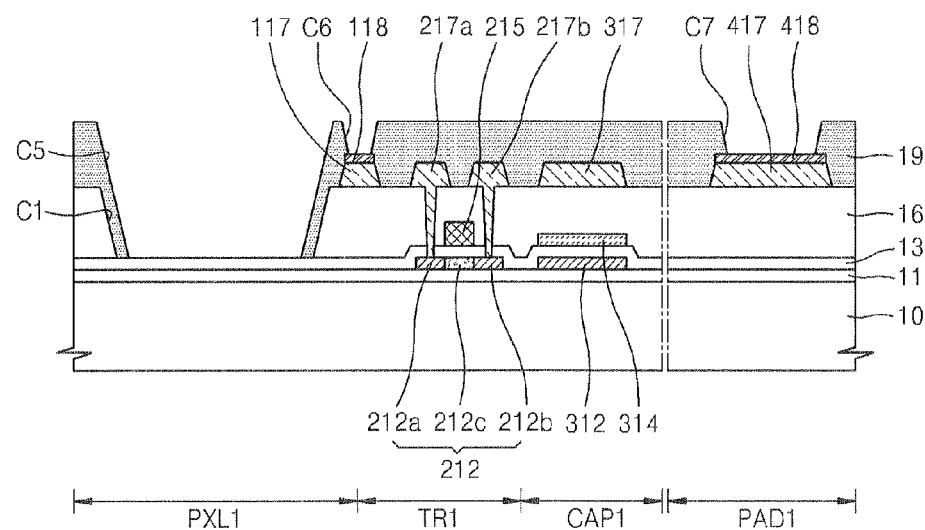

FIG. 3G is a schematic cross-sectional view for explaining a seventh mask process of the organic light-emitting display apparatus 1 according to the present embodiment of the present invention.

In reference to FIG. 3G, the third insulating layer 19 is formed on a resultant structure of the sixth mask process of FIG. 3F and then patterned, and thus the contact hole C6 exposing an upper portion of the second contact layer 118, the contact hole C7 exposing an upper portion of the second pad layer 418, and the opening C5 are formed in the pixel area PXL1 in which the pixel electrode 120 is to be disposed that will be described later.

The third insulating layer 19 is formed to completely surround the source electrode 217a and the drain electrode 217b so as to prevent heterogeneous wirings having different electric potentials from contacting an etchant in which silver (Ag) ions are dissolved during a process of etching the pixel electrode 120 including silver (Ag) that will be described later.

The third insulating layer 19 may include an organic insulating film to function as a planarizing film. The organic insulating film may use general-purpose polymers (PMMA, PS), polymer derivatives having a phenol group, acrylic polymers, imide based polymers, arylether based polymers, amide based polymers, fluorinate polymers, p-xylene based polymers, vinyl alcohol based polymers, blends of these, etc.

The opening C5 formed in the third insulating layer 19 and the opening C1 formed in the second insulating layer 16 overlap with each other while the opening C5 formed in the third insulating layer 19 is smaller than the opening C1 formed in the second insulating layer 16.

Figure 3H:
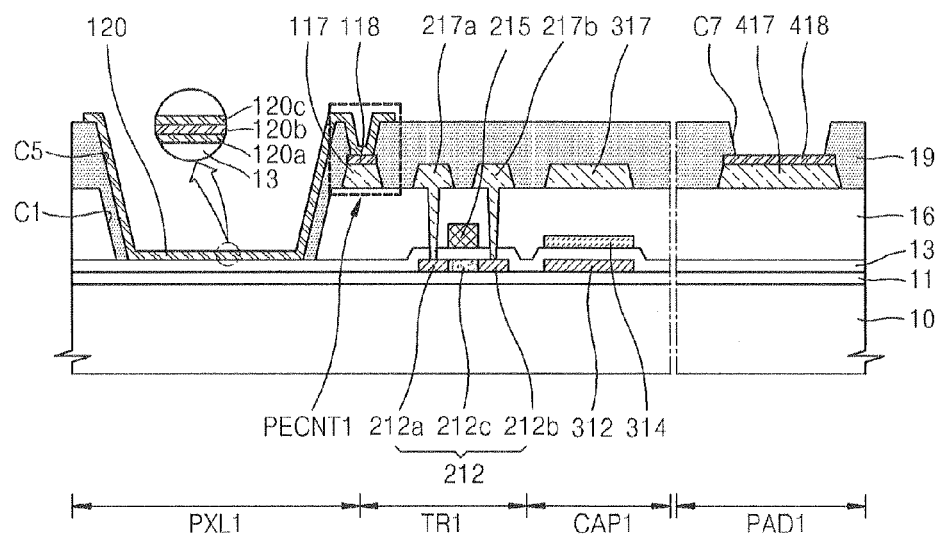

FIG. 3H is a schematic cross-sectional view for explaining an eighth mask process of the organic light-emitting display apparatus 1 according to the present embodiment of the present invention.

In reference to FIG. 3H, a semi-transmissive metal layer (not shown) is formed on a resultant structure of the seventh mask process of FIG. 3G and then patterned, and thus the pixel electrode 120 is formed.

The pixel electrode 120 is connected to a driving transistor through the pixel electrode contact unit PEDOT1 and disposed in the opening C5 formed in the third insulating layer 19.

The pixel electrode 120 includes the transflective metal layer 120b. The pixel electrode 120 may include the layers 120a and 120c that are respectively formed in lower and upper portions of the transflective metal layer 120b and include the transparent conductive oxide protecting the transflective metal layer 120b.

The transflective metal layer 120b may be formed of silver (Ag) or a silver alloy. The layers 120a and 120c including the transparent conductive oxide may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). The transflective metal layer 120b forms a micro cavity structure, along with the opposing electrode 122 that is a reflective electrode that will be described later, thereby increasing light efficiency of the organic light-emitting display apparatus 1.

Meanwhile, if electrons are supplied to metal having a strong reduction like silver (Ag) during an etching process for patterning the pixel electrode 120, silver (Ag) ions present in an etchant in an ion state may be problematically educed as silver (Ag) again. If the source electrode 217a or the drain electrode 217b, the first contact layer 117 of the pixel electrode contact unit PECNT1, the first pad layer 417 of a pad electrode, or a data wiring (not shown) formed of the same material as the materials of these is exposed to the etchant during a process of etching the pixel electrode 120 including silver (Ag), silver (Ag) ions having a strong reduction may be educed as silver (Ag) again by receiving electrons from these metal materials.

However, the source electrode 217a or the drain electrode 217b according to the present embodiment is patterned before the eight mask process of patterning the pixel electrode 120 and is covered by the third insulating layer 19 that is the organic film, and thus the source electrode 217a or the drain electrode 217b is not exposed to the etchant including silver (Ag) ions during the process of etching the pixel electrode 120 including sliver (Ag), thereby preventing a particle related defect due to the eduction of silver (Ag).

Although the first contact layer 117 and the first pad layer 417 according to the present embodiment are respectively disposed in areas exposed by the contact holes C6 and C7 formed in the third insulating layer 19, since the second contact layer 118 and the second pad layer 418 that are protection layers are respectively formed on the first contact layer 117 and the first pad layer 417, the first contact layer 117 and the first pad layer 417 are not exposed to the etchant during the process of etching the pixel electrode (120), thereby preventing a particle related defect due to the eduction of silver (Ag).

Figure 3I:
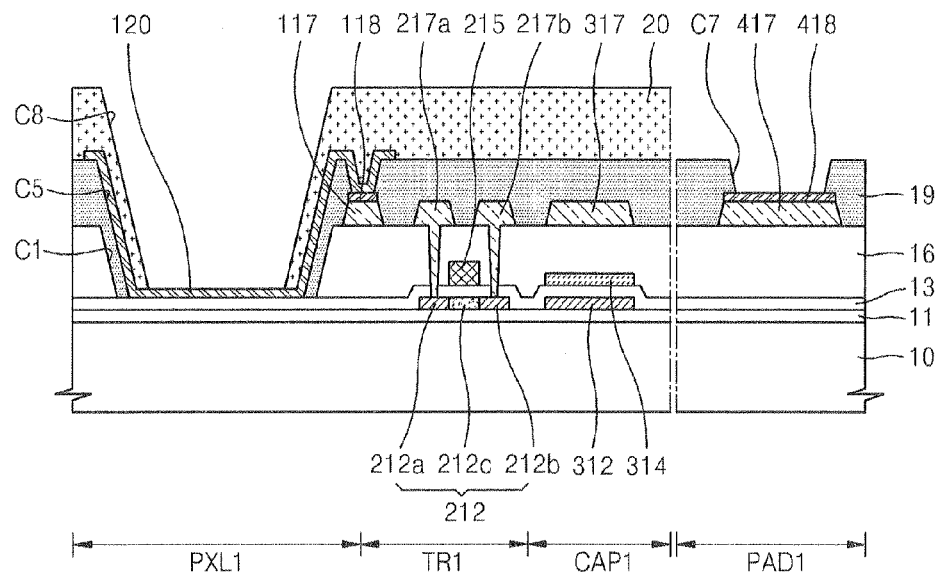

FIG. 3I is a schematic cross-sectional view for explaining a ninth mask process of the organic light-emitting display apparatus 1 according to the present embodiment of the present invention.

In reference to FIG. 3I, the fourth insulating layer 20 is formed on a resultant structure of the eighth mask process of FIG. 3H, and then the ninth mask process of forming the opening C8 exposing an upper portion of the pixel electrode 120 is performed.

The fourth insulating layer 20 functions as a pixel defining layer and may include an organic insulating film including general-purpose polymers (PMMA, PS), polymer derivatives having a phenol group, acrylic polymers, imide based polymers, arylether based polymers, amide based polymers, fluorinate polymers, p-xylene based polymers, vinyl alcohol based polymers, blends of these, etc.

An intermediate layer (not shown) including the organic emission layer 121 of FIG. 2 is formed on a resultant structure of the eighth mask process of FIG. 3H, and the opposing electrode 122 of FIG. 2 is formed.

According to the above-described organic light-emitting display apparatus 1 and method of manufacturing the organic light-emitting display apparatus 1, the pixel electrode 120 includes the semi-transmissive metal layer 120b, thereby increasing light efficiency of the organic light-emitting display apparatus 1 by a micro-cavity.

The source electrode 217a or the drain electrode 217b is covered by the third insulating layer 19 that is the organic film, and thus the source electrode 217a or the drain electrode 217b is not exposed to the etchant including silver (Ag) ions, thereby preventing the particle related defect due to the eduction of silver (Ag).

The second contact layer 118 and the second pad layer 418 that are protection layers are respectively formed on the first contact layer 117 and the first pad layer 417, and thus the first contact layer 117 and the first pad layer 417 are not exposed to the etchant during the process of etching the pixel electrode (120), thereby preventing the particle related defect due to the eduction of silver (Ag).

An organic light-emitting display apparatus 2 according to a first comparison example will now be described with reference to FIG. 4 below.

The same reference numerals denote the same elements below. Differences between the organic light-emitting display apparatus 1 according to the previous embodiment and the organic light-emitting display apparatus 2 according to the first comparison example will now be described.

Figure 4:
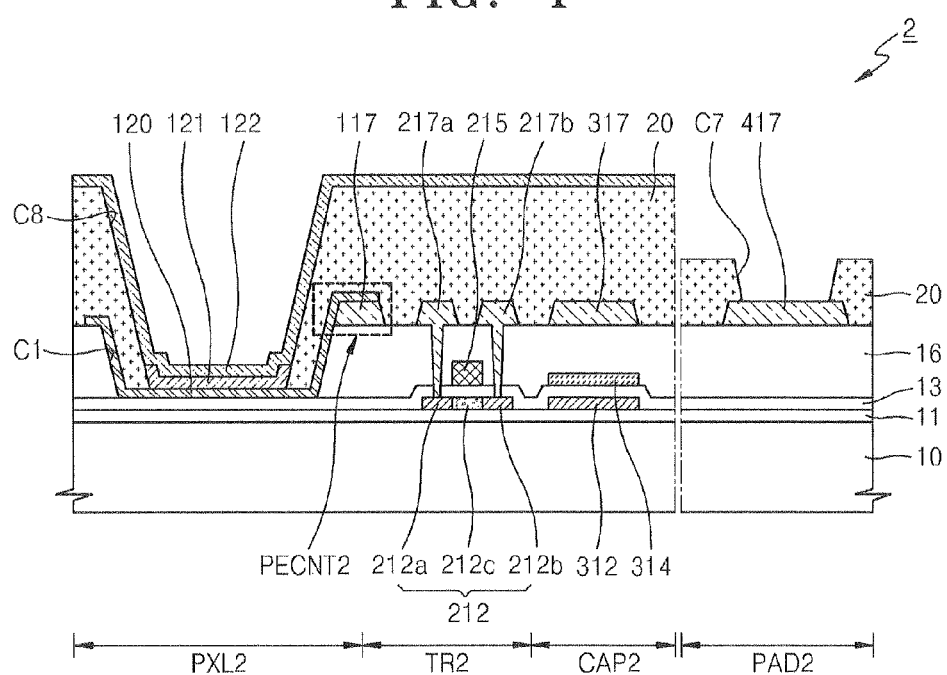
FIG. 4 is a schematic plan view illustrating an organic light-emitting display apparatus according to a first comparison example.

In reference to FIG. 4, a pixel area PXL2 including the at least one organic emission layer 121, a transistor area TR2 including at least one thin film transistor, a capacitor area CAP2 including at least one capacitor, and a pad area PAD2 are provided on the substrate 10.

The active layer 212 of the thin film transistor is provided on the substrate 10 and the buffer layer 11. The gate electrode 215 is provided on the active layer 212 in a location corresponding to the channel area 212c of the active layer 212 with the first insulating layer 13 that is an insulation film disposed between the gate electrode 215 and the active layer 212. The source electrode 217a and the drain electrode 217b that are respectively connected to the source region 212a and the drain region 212b of the active layer 212 are provided on the gate electrode 215 with the second insulating layer 16 that is an interlayer insulating film between the source and drain electrodes 217a and 217b and the gate electrode 215.

Each of the source electrode 217a and the drain electrode 217b may have a structure of two or more heterogeneous metal layers having different electron mobility. For example, each of the source electrode 217a and the drain electrode 217b may have a two or more layer structure including a metal material selected from the group consisting of Al, Pt, Pd, Ag, Mg, Au, Ni, Nd, Ir, Cr, Li, Ca, Mo, Ti, W, Cu, and alloys of these metal materials.

The fourth insulating layer 20 is provided on the second insulating layer 16 to cover the source electrode 217a and the drain electrode 217b. The organic light-emitting display apparatus 2 according to the present comparison example does not include the third insulating layer 19 of FIG. 2 unlike the above-described embodiment of the present invention. The fourth insulating layer 20 functions as a pixel defining layer in the present comparison example.

The pixel electrode 120 is disposed in the opening C1 formed in the second insulating layer 16. An end portion of the pixel electrode 120 is disposed on a top end of the opening C1 formed in the second insulating layer 16 and covered by the fourth insulating layer 20. A pixel contact unit PECNT2 may include the first contact layer 117 including the same material as those of the source electrode 217a and the drain electrode 217b. A protection layer like the second contact layer 118 of FIG. 2 of the previous embodiment of the present invention is not formed on the first contact layer 117 of the organic light-emitting display apparatus 2 according to the present comparison example.

When the pixel electrode 120 includes metal having a strong reduction like silver (Ag) as the transflective metal layer 120b as described in the previous embodiment of the present invention, the source electrode 217a or the drain electrode 217b according to the present comparison example is not covered by the third insulating layer 19 of FIG. 2 of the previous embodiment of the present invention that is an organic film, and thus the source electrode 217a or the drain electrode 217b is completely exposed to an etchant during a process of etching the pixel electrode 120. Thus, since silver (Ag) ions having the strong reduction are educed again, a particle related defect may not be prevented.

The pad area PAD2 may include the first pad layer 417 formed of the same material as those of the source electrode 217a and the drain electrode 217b. The first pad layer 417 is not covered by the third insulating layer 19 of FIG. 2 of the previous embodiment of the present invention that is the organic film, and thus the first pad layer 417 is completely exposed to the etchant during the process of etching the pixel electrode 120. Thus, since silver (Ag) ions having the strong reduction are educed again, the particle related defect may not be prevented, and a reliability of pads may not be secured.

An organic light-emitting display apparatus 3 according to a second comparison example will now be described with reference to FIG. 5 below.

The same reference numerals denote the same elements below. Differences between the organic light-emitting display apparatus 1 according to the previous embodiment and the organic light-emitting display apparatus 3 according to the second comparison example will now be described.

Figure 5:
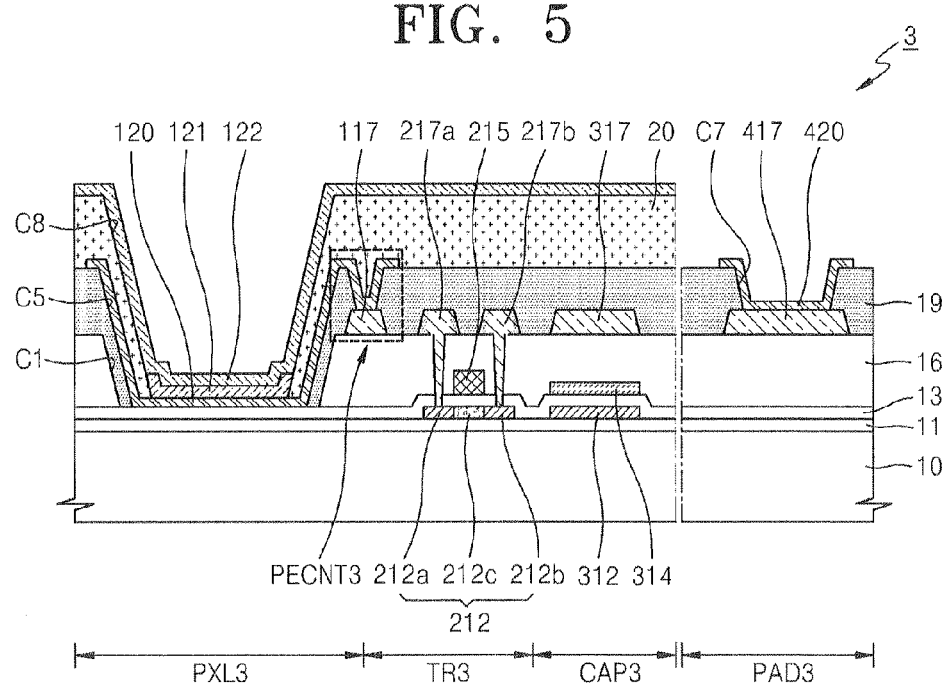
FIG. 5 is a schematic plan view illustrating an organic light-emitting display apparatus according to a second comparison example.

In reference to FIG. 5, a pixel area PXL3 including the at least one organic emission layer 121, a transistor area TR3 including at least one thin film transistor, a capacitor area CAP3 including at least one capacitor, and a pad area PAD3 are provided on the substrate 10.

The active layer 212 of the thin film transistor is provided on the substrate 10 and the buffer layer 11. The gate electrode 215 is provided on the active layer 212 in a location corresponding to the channel area 212c of the active layer 212 with the first insulating layer 13 that is an insulation film disposed between the gate electrode 215 and the active layer 212. The source electrode 217a and the drain electrode 217b that are respectively connected to the source region 212a and the drain region 212b of the active layer 212 are provided on the gate electrode 215 with the second insulating layer 16 that is an interlayer insulating film between the source and drain electrodes 217a and 217b and the gate electrode 215.

Each of the source electrode 217a and the drain electrode 217b may have a structure of two or more heterogeneous metal layers having different electron mobility. For example, each of the source electrode 217a and the drain electrode 217b may have a two or more layer structure including a metal material selected from the group consisting of Al, Pt, Pd, Ag, Mg, Au, Ni, Nd, Ir, Cr, Li, Ca, Mo, Ti, W, Cu, and alloys of these metal materials.

The third insulating layer 19 is provided on the second insulating layer 16 to cover the source electrode 217a and the drain electrode 217b. The organic light-emitting display apparatus 3 according to the present comparison example includes the fourth insulating layer 20 that functions as a pixel defining layer.

The pixel electrode 120 is disposed in the opening C1 formed in the third insulating layer 19 as described in the previous embodiment of the present invention. An end portion of the pixel electrode 120 is disposed on a top end of the opening C1 formed in the second insulating layer 16 and covered by the third insulating layer 19.

A pixel contact unit PECNT3 electrically connects the pixel electrode 120 with one of a source electrode and a drain electrode of a driving transistor. The pixel contact unit PECNT3 includes the first contact layer 117 including the same material as those of the source electrode 217a and the drain electrode 217b and does not include a protection layer.

When the pixel electrode 120 includes metal having a strong reduction like silver (Ag) as the transflective metal layer 120b as described in the previous embodiment of the present invention, the source electrode 217a or the drain electrode 217b according to the present comparison example is covered by the third insulating layer 19 of FIG. 2 of the previous embodiment of the present invention that is an organic film, and thus the source electrode 217a or the drain electrode 217b is not exposed to an etchant during a process of etching the pixel electrode 120. Thus, silver (Ag) ions are not reduced due to electrons supplied by the source electrode 217a or the drain electrode 217b.

However, since the first contact layer 117 of the pixel contact unit PECNT3 does not include a protection layer including a transparent conductive oxide unlike the previous embodiment of the present invention, the first contact layer 117 is exposed to the etchant through the opening C6 formed in the third insulating layer 19, which makes it difficult to prevent a particle related defect.

Meanwhile, the pad area PAD3 may include the first pad layer 417 formed of the same material as those of the source electrode 217a and the drain electrode 217b and a second pad layer 420 formed of the same material as that of the pixel electrode 120.

The second pad layer 420 is formed in the contact hole C7 formed in the third insulating layer 19. The second pad layer 420 covers an upper portion of the first pad layer 417 during the process of etching the pixel electrode 120, thereby protecting the first pad layer 417. However, after the pixel electrode 120 is completely etched, an end portion of the second pad layer 420 including a semi-transmissive metal layer is exposed to the outside, and, during a subsequent process, is corroded due to a vulnerable chemical property resistance of the semi-transmissive metal layer, which may cause a deterioration of reliability of pads.

An organic light-emitting display apparatus 4 according to another embodiment of the present invention and a method of manufacturing the organic light-emitting display apparatus 4 will now be described with reference to FIGS. 6 and 7A through 7I below.

The same reference numerals denote the same elements below. Differences between the organic light-emitting display apparatus 1 according to the previous embodiment and the organic light-emitting display apparatus 4 according to the present embodiment will now be described.

Figure 6:
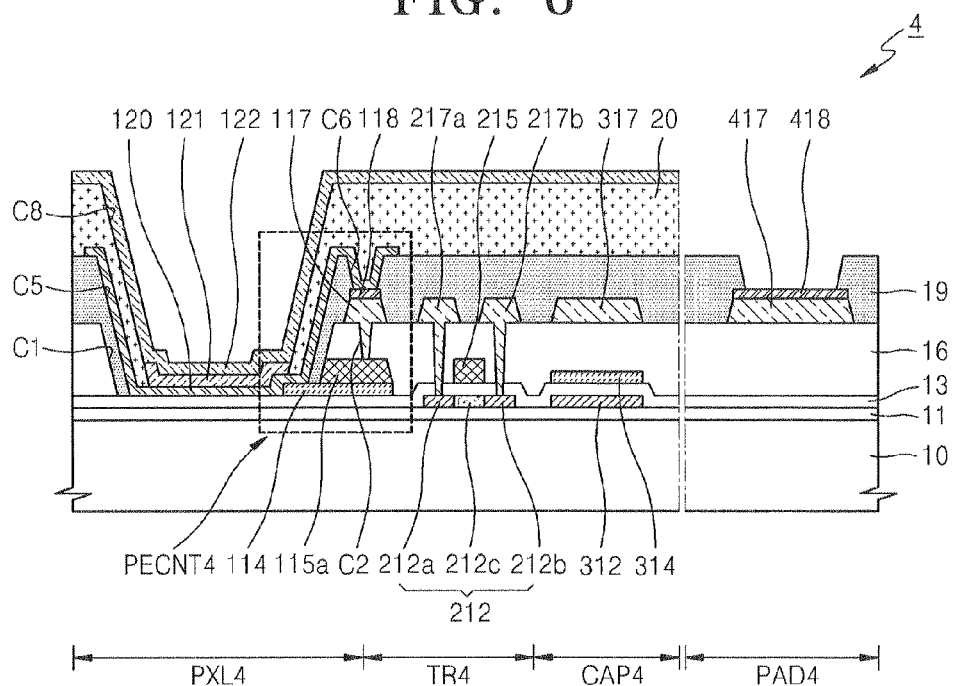
FIG. 6 is a schematic plan view illustrating an organic light-emitting display apparatus according to another embodiment of the present invention.

In reference to FIG. 6, a pixel area PXL4 including the at least one organic emission layer 121, a transistor area TR4 including at least one thin film transistor, a capacitor area CAP4 including at least one capacitor, and a pad area PAD4 are provided on the substrate 10.

The organic light-emitting display apparatus 4 according to the present embodiment may prevent silver (Ag) from being educed due to an etchant when the pixel electrode 120 including silver (Ag) is patterned since the third insulating layer 19 covers the source electrode 217a and the drain electrode 217b and an end portion of the second pad layer 418 as described in the previous embodiment.

The organic light-emitting display apparatus 4 including a pixel electrode contact unit PECNT4 according to the present embodiment is different from the previous embodiment.

The pixel electrode contact unit PECNT4 of the present embodiment includes the first contact layer 117 including the same material as those of the source electrode 217a and the drain electrode 217b, the second contact layer 118 including a transparent conductive oxide, a third contact layer 114 including the transparent conductive oxide, and a fourth contact layer 115a including the same material as that of the gate electrode 215.

The third contact layer 114 is formed by protruding from etching surfaces of the opening C1 formed in the second insulating layer 16 and the opening C5 formed in the third insulating layer 19. Thus, the pixel electrode 120 directly contacts the third contact layer 114 that protrudes, and the third contact layer 114 contacts the fourth contact layer 115a. The fourth contact layer 115a and the first contact layer 117 contact each other through a contact hole C2 formed in the second insulating layer 16.

That is, according to the present embodiment, when the pixel electrode 120 and a driving device are electrically connected to each other by using the contact hole C6 formed in the third insulating layer 19, i.e. the first contact layer 117 and the second contact layer 118, since a thickness of the pixel electrode 120 that is used as a semi-transmissive metal layer is small, a step coverage is defective, and thus a stable connection through an etching surface of the third insulating layer 19 or the contact hole C6 may be difficult. However, according to the present embodiment, even if the connection through the contact hole C6 formed in the third insulating layer 19 fails, since the pixel electrode 120 directly contacts the third contact layer 114 on a floor portion of the opening C5, a signal may be advantageously received from the driving device normally.

A method of manufacturing the organic light-emitting display apparatus 4 will now be described with reference to FIGS. 7A through 7I below.

Figure 7A:
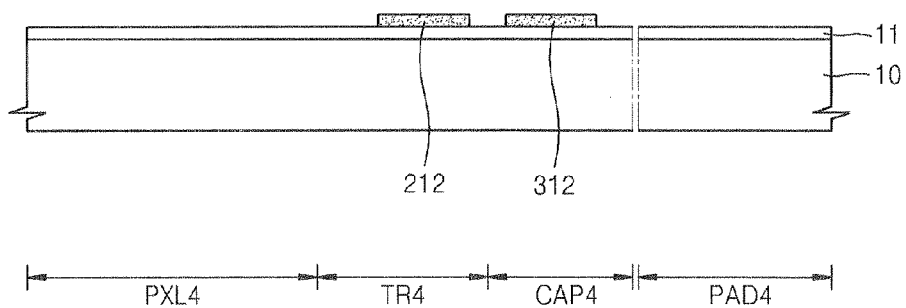
FIGS. 7A through 7I are schematic cross-sectional views for explaining a method of manufacturing the organic light-emitting display apparatus of FIG. 6, according to an embodiment of the present invention.

FIG. 7A is a schematic cross-sectional view for explaining a first mask process of the organic light-emitting display apparatus 4 according to the present embodiment of the present invention.

In reference to FIG. 7A, the buffer layer 11 is formed on the substrate 10 and a semiconductor layer (not shown) is formed on the buffer layer 11 and patterned, and thus the active layer 212 of a thin film transistor and the first electrode 312 of a capacitor are formed.

Figure 7B:
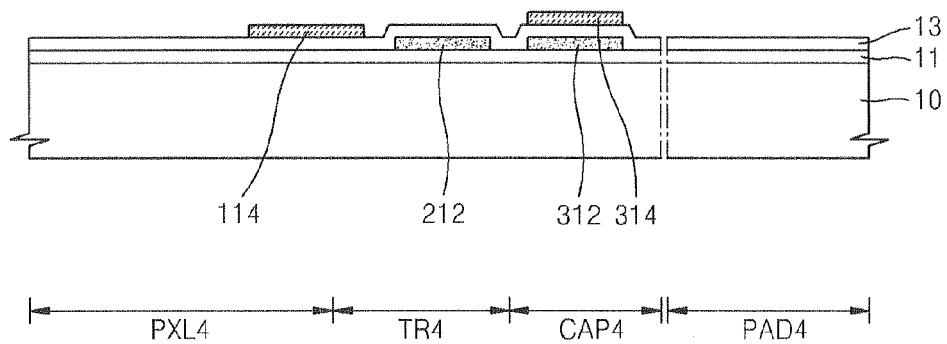

FIG. 7B is a schematic cross-sectional view for explaining a second mask process of the organic light-emitting display apparatus 4 according to the present embodiment of the present invention.

The first insulating layer 13 is formed on a resultant structure of the first mask process of FIG. 7A, a transparent conductive oxide layer (not shown) is formed on the first insulating layer 13 and then patterned.

As a result of the patterning, the second electrode 314 of the capacitor and the third contact layer 114 are formed on the first insulating layer 13.

Figure 7C:
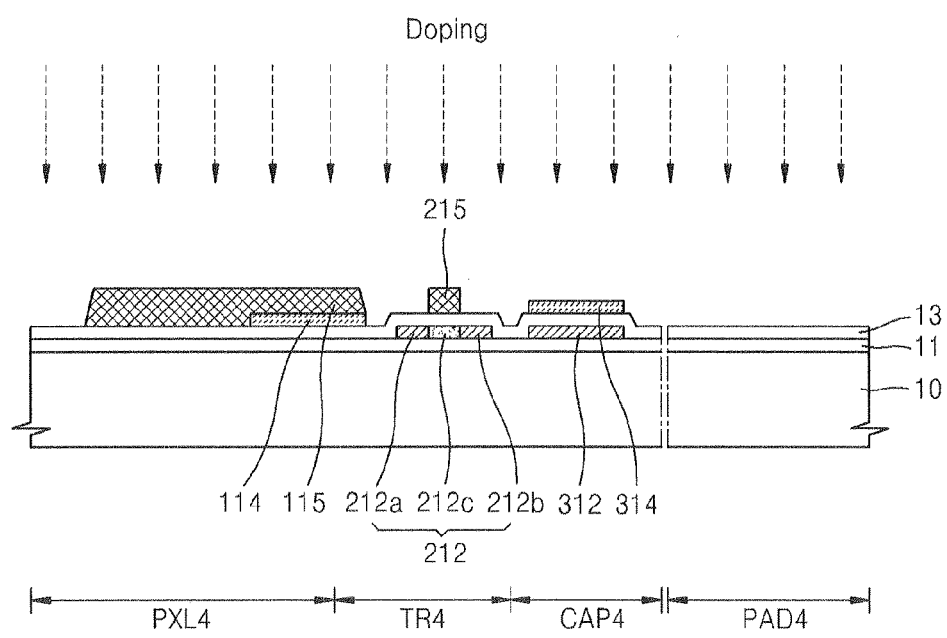

FIG. 7C is a schematic cross-sectional view for explaining a third mask process of the organic light-emitting display apparatus 4 according to the present embodiment of the present invention.

A first metal layer (not shown) is deposited on a resultant structure of the second mask process of FIG. 7B and then patterned. In this regard, as described above, the first metal layer (not shown) may be a single layer or a multilayer formed of one or more metal materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

As a result of the patterning, the gate electrode 215 and a gate metal layer 115 covering the third contact layer 114 are formed on the first insulating layer 13.

The above-described structure is doped with ion impurities. The active layer 212 of the thin film transistor and the first electrode 312 of the capacitor are doped with ion impurities B or P at a concentration of $1 \times 10^{15}$ atoms/cm$^2$ or more.

Therefore, the first electrode 312 of the capacitor as well as the active layer 212 are simultaneously doped by using one time doping process, thereby reducing manufacturing cost resulted from a reduction in the doping process.

Figure 7D:
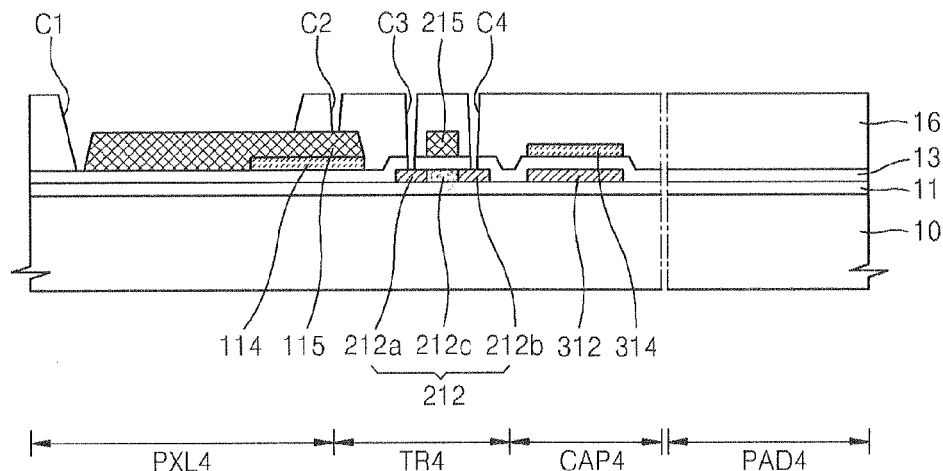

FIG. 7D is a schematic cross-sectional view for explaining a fourth mask process of the organic light-emitting display apparatus 4 according to the present embodiment of the present invention.

In reference to FIG. 7D, the second insulating layer 16 is formed on a resultant structure of the third mask process of FIG. 7C and then patterned, and thus openings C3 and C4 exposing the source area 212a and the drain area 212b of the active layer 212 and the contact hole C2 of the pixel electrode contact unit PECNT4, and the opening C1 are formed in an area spaced apart from a side of the active layer 212 and in which the gate metal layer 115 is formed as an area in which the pixel electrode 120 is to be disposed that will be described later.

Figure 7E:
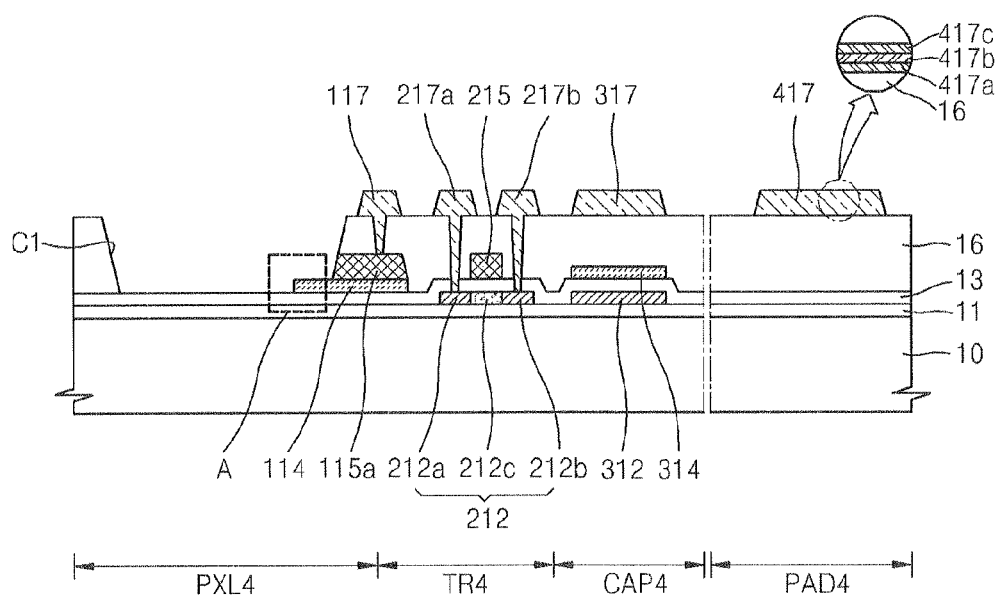

FIG. 7E is a schematic cross-sectional view for explaining a fifth mask process of the organic light-emitting display apparatus 4 according to the present embodiment of the present invention.

In reference to FIG. 7E, a second metal layer (not shown) is formed on a resultant structure of the fourth mask process of FIG. 7D and then patterned, and thus the source electrode 217a and the drain electrode 217b, the first contact layer 117 of the pixel electrode contact unit PECNT4, and the first pad layer 417 of a pad electrode are simultaneously formed. In this regard, the gate metal layer 115 disposed in the opening C1 is removed so that an end portion A of the third contact layer 114 protrudes. In this regard, the end portion A of the third contact layer 114 is formed by protruding further than an etching surface of the opening C1 formed in the second insulating layer 16.

Figure 7F:
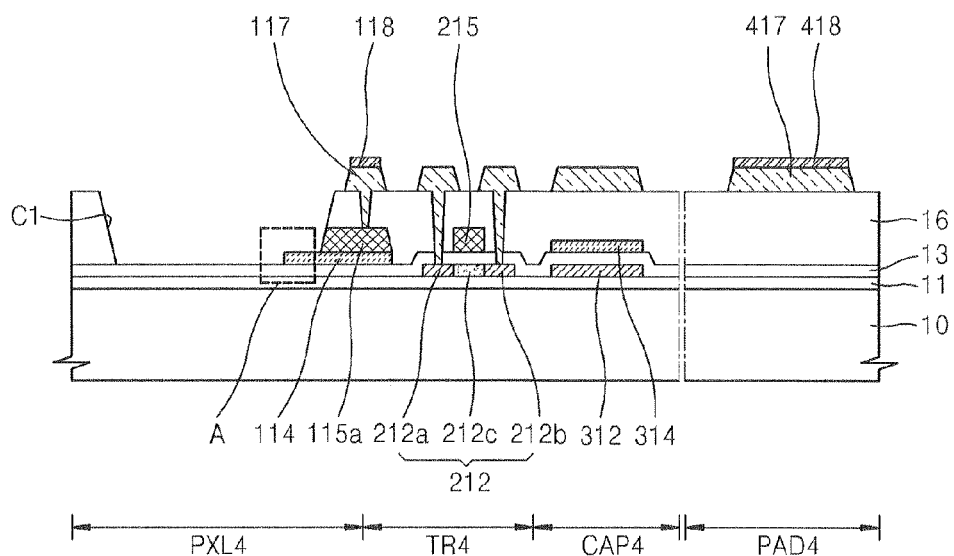

FIG. 7F is a schematic cross-sectional view for explaining a sixth mask process of the organic light-emitting display apparatus 4 according to the present embodiment of the present invention.

In reference to FIG. 7F, a transparent conductive oxide layer (not shown) is formed on a resultant structure of the fifth mask process of FIG. 7E and then patterned, and thus the second contact layer 118 of the pixel electrode contact unit PECNT4 and the second pad layer 418 of the pad electrode are simultaneously formed.

Figure 7G:
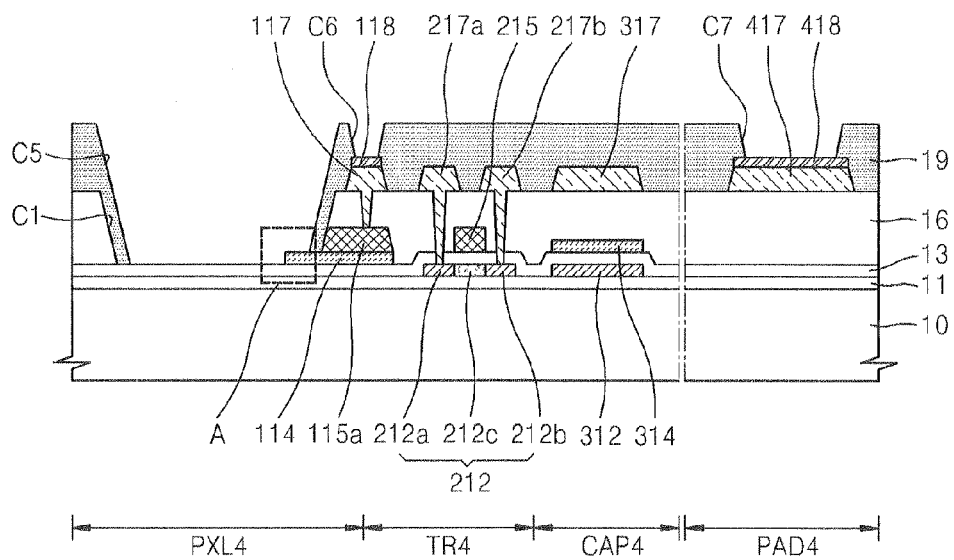

FIG. 7G is a schematic cross-sectional view for explaining a seventh mask process of the organic light-emitting display apparatus 4 according to the present embodiment of the present invention.

In reference to FIG. 7G, the third insulating layer 19 is formed on a resultant structure of the sixth mask process of FIG. 7F and then patterned, and thus the contact hole C6 exposing an upper portion of the second contact layer 118, the contact hole C7 exposing an upper portion of the second pad layer 418, and the opening C5 are formed in the pixel area PXL4 in which the pixel electrode 120 is to be disposed that will be described later.

The third insulating layer 19 is formed to completely surround the source electrode 217a and the drain electrode 217b so as to prevent heterogeneous wirings having different electric potentials from contacting an etchant in which silver (Ag) ions are dissolved during a process of etching the pixel electrode 120 including silver (Ag) that will be described later.

Figure 7H:
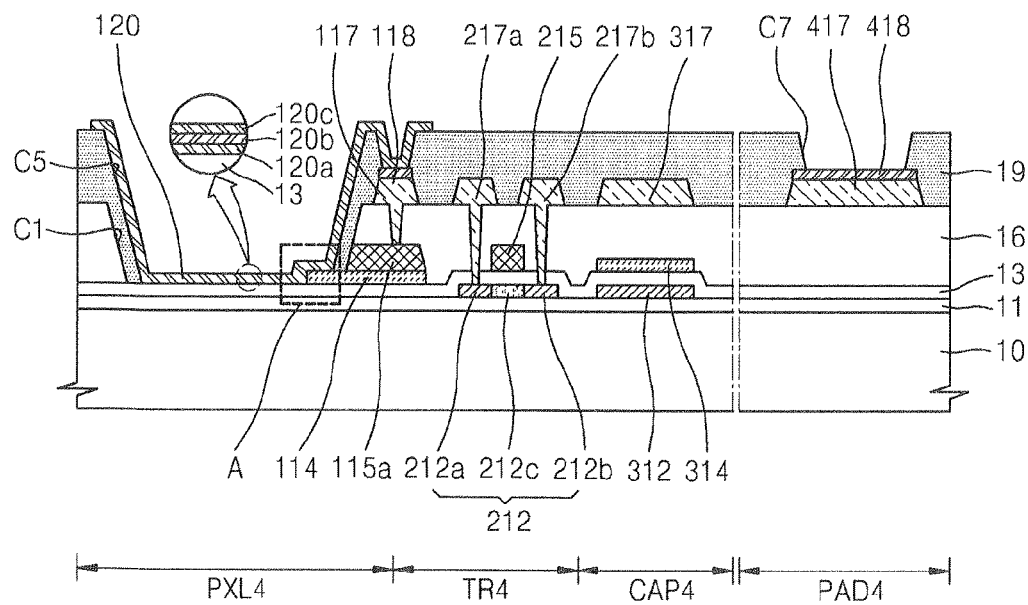

FIG. 7H is a schematic cross-sectional view for explaining an eighth mask process of the organic light-emitting display apparatus 4 according to the present embodiment of the present invention.

In reference to FIG. 7H, a semi-transmissive metal layer (not shown) is formed on a resultant structure of the seventh mask process of FIG. 7G and then patterned, and thus the pixel electrode 120 is formed.

The pixel electrode 120 includes the transflective metal layer 120b. The pixel electrode 120 may include the layers 120a and 120c that are respectively formed in lower and upper portions of the transflective metal layer 120b and include the transparent conductive oxide protecting the transflective metal layer 120b.

The pixel electrode 120 is connected to a driving transistor through the pixel electrode contact unit PEDOT1 and disposed in the opening C5 formed in the third insulating layer 19.

The pixel electrode contact unit PECNT4 of the present embodiment includes the first contact layer 117 including the same material as those of the source electrode 217a and the drain electrode 217b, the second contact layer 118 including a transparent conductive oxide, the third contact layer 114 including the transparent conductive oxide, and the fourth contact layer 115a including the same material as that of the gate electrode 215.

The third contact layer 114 is formed by protruding from etching surfaces of the opening C1 formed in the second insulating layer 16 and the opening C5 formed in the third insulating layer 19. Thus, the pixel electrode 120 directly contacts the third contact layer 114 that protrudes, and the third contact layer 114 contacts the fourth contact layer 115a. The fourth contact layer 115a and the first contact layer 117 contact each other through the contact hole C2 formed in the second insulating layer 16.

That is, according to the present embodiment, when the pixel electrode 120 and a driving device are electrically connected to each other by using the contact hole C6 formed in the third insulating layer 19, i.e. the first contact layer 117 and the second contact layer 118, since a thickness of the pixel electrode 120 that is used as a semi-transmissive metal layer is small, a step coverage is defective, and thus a stable connection through an etching surface of the third insulating layer 19 or the contact hole C6 may be difficult. However, according to the present embodiment, even if the connection through the contact hole C6 formed in the third insulating layer 19 fails, since the pixel electrode 120 directly contacts the third contact layer 114 on a floor portion of the opening C5, a signal may be advantageously received from the driving device normally.

Figure 7I:
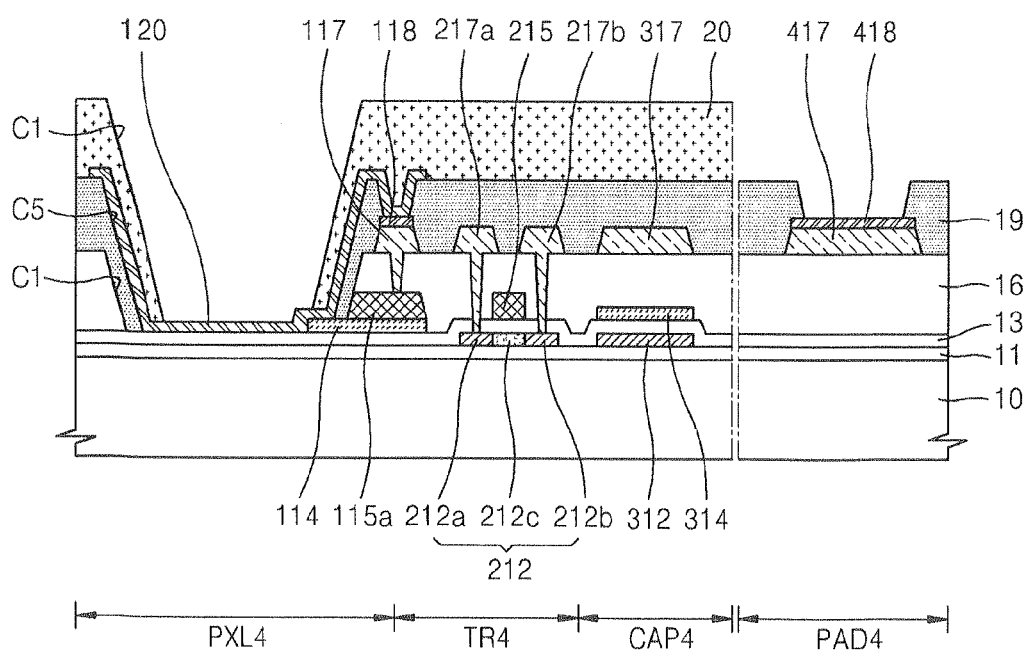

FIG. 7I is a schematic cross-sectional view for explaining a ninth mask process of the organic light-emitting display apparatus 4 according to the present embodiment of the present invention.

In reference to FIG. 7I, the fourth insulating layer 20 is formed on a resultant structure of the eighth mask process of FIG. 7H, and then the ninth mask process of forming the opening C8 exposing an upper portion of the pixel electrode 120 is performed.

An intermediate layer (not shown) including the organic emission layer 121 of FIG. 2 is formed on a resultant structure of the eighth mask process of FIG. 7H, and the opposing electrode 122 of FIG. 2 is formed.

According to the above-described organic light-emitting display apparatus 4 and method of manufacturing the organic light-emitting display apparatus 4, the pixel electrode 120 includes the semi-transmissive metal layer 120b, thereby increasing light efficiency of the organic light-emitting display apparatus 1 by a micro-cavity.

The source electrode 217a or the drain electrode 217b is covered by the third insulating layer 19 that is the organic film, and thus the source electrode 217a or the drain electrode 217b is not exposed to the etchant including silver (Ag) ions, thereby preventing the particle related defect due to the eduction of silver (Ag).

The second contact layer 118 and the second pad layer 418 that are protection layers are respectively formed on the first contact layer 117 and the first pad layer 417, and thus the first contact layer 117 and the first pad layer 417 are not exposed to the etchant during the process of etching the pixel electrode (120), thereby preventing the particle related defect due to the eduction of silver (Ag).

In addition, a structure of the pixel electrode contact unit PECNT4 is dualized, thereby preventing a signal short circuit between the pixel electrode and a driving device.

An organic light-emitting display apparatus 5 and a method of manufacturing the organic light-emitting display apparatus 5 according to another embodiment of the present invention will now be described with reference to FIG. 8 below.

The same reference numerals denote the same elements below. Differences between the organic light-emitting display apparatus 1 according to the previous embodiment and the organic light-emitting display apparatus 5 according to the present embodiment will now be described.

The organic light-emitting display apparatus 5 according to the present embodiment further includes the cathode contact unit CECNT compared to the organic light-emitting display apparatus 1.

An organic light-emitting display apparatus to which the present invention is applied is a bottom emission light-emitting display apparatus in which light is emitted from the organic emission layer 121 to the substrate 10 to form an image. Thus, the opposing electrode 122 is configured as a reflective electrode.

The opposing electrode 122 is not separately formed for each pixel but is configured as a common electrode covering the whole display area DA of FIG. 1, forms the cathode contact unit CECNT outside the display area DA, and sends a signal to the common electrode.

Figure 8:
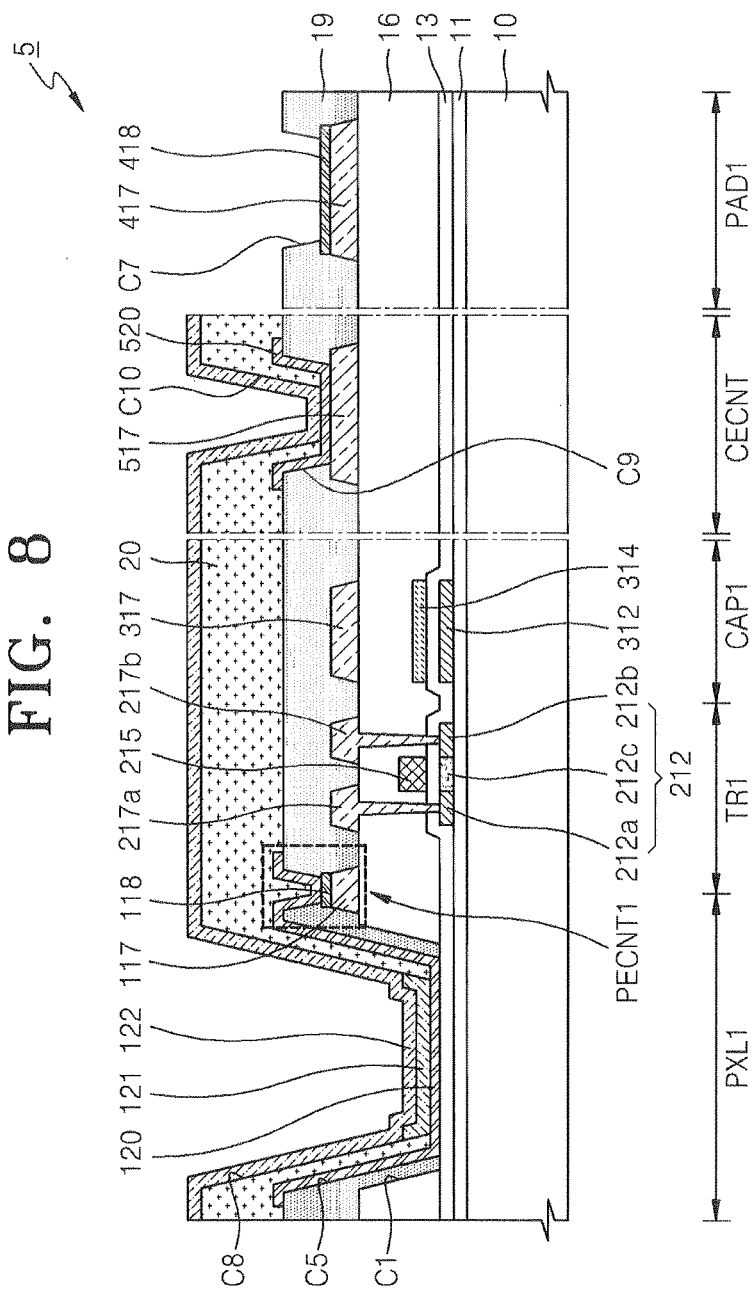
FIG. 8 is a schematic plan view illustrating an organic light-emitting display apparatus according to another embodiment of the present invention.

Although the cathode contact unit CECNT is disposed between the display area DA and the pad PA in FIG. 8, the present invention is not limited thereto. The cathode contact unit CECNT may be disposed in any locations between the display area DA and the sealing line SL.

The cathode contact unit CECNT includes a first contact layer 517 and a second contact layer 520.

The first contact layer 517 may be disposed on the second insulating layer 16 and may be formed of the same material as those of the source electrode 217a, the drain electrode 217b, and the first pad layer 417. That is, the first contact layer 517 may have a structure of two or more heterogeneous metal layers having different electron mobility. For example, the first contact layer 517 may have a two or more layer structure including metal materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and alloys of these metal materials.

The second contact layer 520 may be provided in the contact hole C9 formed in the third insulating layer 19 and may be formed of the same material as that of the pixel electrode 120. That is, the second contact layer 520 may include a semi-transmissive metal layer formed of silver (Ag) or a silver (Ag) alloy.

The opposing electrode 122 is connected to the second contact layer 520 of the cathode contact unit CECNT through a contact hole C10 formed in the fourth insulating layer 20. The opposing electrode 122 is formed widely on the whole display area DA, and thus a voltage drop due to a resistance is important. However, according to the present embodiment, the cathode contact unit CECNT uses the second contact layer 520 including the semi-transmissive metal layer formed of silver (Ag) having a low resistance, thereby preventing the voltage drop due to a resistance. The second contact layer 520 may be formed simultaneously with the pixel electrode 120, and thus no additional process is needed.

An organic light-emitting display apparatus 6 and a method of manufacturing the organic light-emitting display apparatus 6 according to another embodiment of the present invention will now be described with reference to FIG. 9 below.

The same reference numerals denote the same elements below. Differences between the organic light-emitting display apparatus 4 according to the previous embodiment and the organic light-emitting display apparatus 6 according to the present embodiment will now be described.

The organic light-emitting display apparatus 6 according to the present embodiment further includes the cathode contact unit CECNT compared to the organic light-emitting display apparatus 4.

An organic light-emitting display apparatus to which the present invention is applied is a bottom emission light-emitting display apparatus in which light is emitted from the organic emission layer 121 to the substrate 10 to form an image. Thus, the opposing electrode 122 is configured as a reflective electrode.

The opposing electrode 122 is not separately formed for each pixel but is configured as a common electrode covering the whole display area DA of FIG. 1, forms the cathode contact unit CECNT outside the display area DA, and sends a signal to the common electrode.

Figure 9:
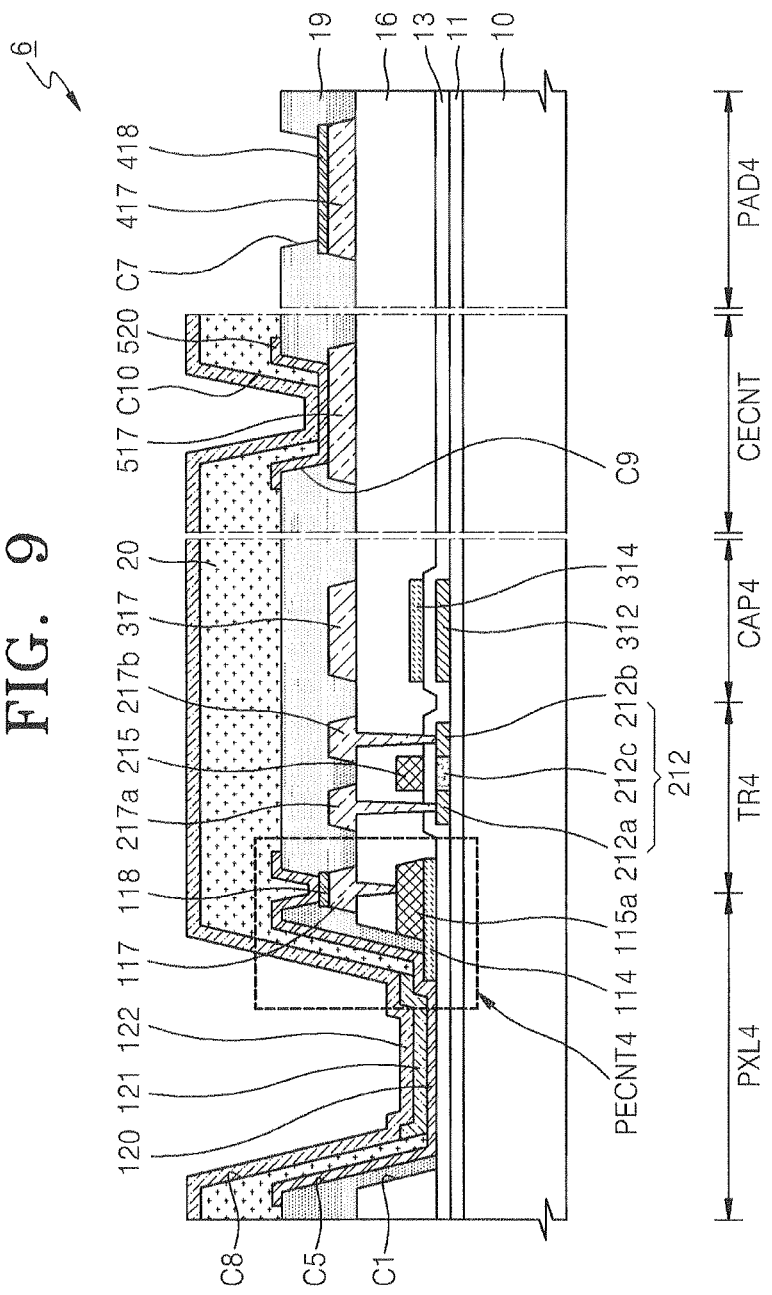
FIG. 9 is a schematic plan view illustrating an organic light-emitting display apparatus according to another embodiment of the present invention.

Although the cathode contact unit CECNT is disposed between the display area DA and the pad PA in FIG. 9, the present invention is not limited thereto. The cathode contact unit CECNT may be disposed in any locations between the display area DA and the sealing line SL.

The cathode contact unit CECNT includes the first contact layer 517 and the second contact layer 520.

The first contact layer 517 may be disposed on the second insulating layer 16 and may be formed of the same material as those of the source electrode 217a, the drain electrode 217b, and the first pad layer 417. That is, the first contact layer 517 may have a structure of two or more heterogeneous metal layers having different electron mobility. For example, the first contact layer 517 may have a two or more layer structure including metal materials selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and alloys of these metal materials.

The second contact layer 520 may be provided in the contact hole C9 formed in the third insulating layer 19 and may be formed of the same material as that of the pixel electrode 120. That is, the second contact layer 520 may include a semi-transmissive metal layer formed of silver (Ag) or a silver (Ag) alloy.

The opposing electrode 122 is connected to the second contact layer 520 of the cathode contact unit CECNT through the contact hole C10 formed in the fourth insulating layer 20. The opposing electrode 122 is formed widely on the whole display area DA, and thus a voltage drop due to a resistance is important. However, according to the present embodiment, the cathode contact unit CECNT uses the second contact layer 520 including the semi-transmissive metal layer formed of silver (Ag) having a low resistance, thereby preventing the voltage drop due to a resistance. The second contact layer 520 may be formed simultaneously with the pixel electrode 120, and thus no additional process is needed.

As described above, the organic light-emitting display apparatus and method of manufacturing the same according to the present invention provide the following effects:

First, a pixel electrode is formed as a semi-transmissive metal layer, thereby increasing light efficiency of a display apparatus by a micro cavity.

Second, a source electrode and a drain electrode (including a data wire) are covered by a third insulation layer that is an organic film, thereby preventing silver (Ag) from being educing again due to the source electrode and the drain electrode when the pixel electrode is patterned.

Third, protection layer are formed on a first contact layer of a pixel electrode contact unit and a top portion of a first pad layer of a pad electrode, thereby preventing silver (Ag) from being educing again due to the first contact layer and the first pad layer when the pixel electrode is patterned.

Fourth, a structure of the pixel electrode contact unit is dualized, thereby preventing a signal short circuit between the pixel electrode and a driving device.

Fifth, a cathode contact unit uses the semi-transmissive metal layer that is the same as the pixel electrode and has a small resistance, thereby preventing a voltage drop of an opposing electrode that is a common electrode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display apparatus, comprising:
   a thin film transistor comprising an active layer, a gate electrode, a source electrode, a drain electrode, a first insulating layer disposed between the active layer and the gate electrode, and a second insulating layer disposed between the gate electrode and the source electrode and the drain electrode;
   a pad electrode comprising a first pad layer disposed on the same layer as the source electrode and the drain electrode and a second pad layer disposed on the first pad layer;
   a third insulating layer covering the source electrode and the drain electrode and an end portion of the pad electrode;
   a pixel electrode comprising a semi-transmissive metal layer and disposed in an opening formed in the third insulating layer;
   a fourth insulating layer having an opening formed in a location corresponding to an opening formed in the third insulating layer and covering an end portion of the pixel electrode;
   an organic emission layer disposed on the pixel electrode; and
   an opposing electrode disposed on the organic emission layer.

2. The organic light-emitting display apparatus of claim 1, wherein the source electrode and the drain electrode have a stack structure of a plurality of heterogeneous metal layers having different electron mobility.

3. The organic light-emitting display apparatus of claim 2, wherein the source electrode and the drain electrode comprise a layer including molybdenum and a layer including aluminum.

4. The organic light-emitting display apparatus of claim 1, further comprising: a capacitor comprising a first electrode disposed on the same layer as the active layer and a second electrode disposed on the same layer as the gate electrode.

5. The organic light-emitting display apparatus of claim 4, wherein the first electrode of the capacitor comprises a semiconductor material doped with ion impurities.

6. The organic light-emitting display apparatus of claim 4, wherein the second electrode of the capacitor comprises a transparent conductive oxide.

7. The organic light-emitting display apparatus of claim 4, wherein the capacitor further comprises a third electrode disposed on the same layer as the source electrode and the drain electrode.

8. The organic light-emitting display apparatus of claim 1, wherein the first pad layer comprises the same material as those of the source electrode and the drain electrode.

9. The organic light-emitting display apparatus of claim 8, wherein the first pad layer comprises a layer including molybdenum and a layer including aluminum.

10. The organic light-emitting display apparatus of claim 1, wherein the second pad layer comprises a transparent conductive oxide.

11. The organic light-emitting display apparatus of claim 1, wherein the semi-transmissive metal layer comprises sliver (Ag) or a silver alloy.

12. The organic light-emitting display apparatus of claim 11, wherein a protection layer is further stacked on the semi-transmissive metal layer.

13. The organic light-emitting display apparatus of claim 12, wherein the protection layer comprises a transparent conductive oxide.

14. The organic light-emitting display apparatus of claim 1, wherein the third insulating layer is an organic insulating film.

15. The organic light-emitting display apparatus of claim 1, wherein the fourth insulating layer is an organic insulating film.

16. The organic light-emitting display apparatus of claim 1, further comprised of:
  an opening formed in the second insulating layer,
  the opening formed in the third insulating layer and the opening formed in the fourth insulating layer overlapping each other, and
  the opening formed in the third insulating layer being greater than the opening formed in the fourth insulating layer and smaller than the opening formed in the second insulating layer.

17. The organic light-emitting display apparatus of claim 16, wherein the end portion of the pixel electrode is disposed on a top end of the opening formed in the third insulating layer.

18. The organic light-emitting display apparatus of claim 1, further comprising:
  a cathode contact unit comprising a first contact layer disposed on the second insulating layer and comprising the same material as that of the first pad layer; and
  a second contact layer connected to the first contact layer through a contact hole formed in the third insulating layer, connected to the opposing electrode through a contact hole formed in the fourth insulating layer, and comprising the same material as that of the pixel electrode.

19. The organic light-emitting display apparatus of claim 1, further comprising:
  a pixel electrode contact unit which electrically connects the pixel electrode to one of the source electrode and the drain electrode through a contact hole formed in the third insulating layer,
  the pixel electrode contact unit comprising:
    a first contact layer comprising the same material as those of the source electrode and the drain electrode; and
    a second contact layer comprising the same material as that of the second pad layer.

20. The organic light-emitting display apparatus of claim 19, wherein the pixel electrode contact unit further comprises a third contact layer disposed on the first insulating layer and the second insulating layer and comprising the same material as that of the second electrode,
  wherein the first contact layer is electrically connected to the third contact layer through a contact hole formed in the second insulating layer.

21. The organic light-emitting display apparatus of claim 20, wherein an end portion of the third contact layer protrudes from an etching surface of an opening formed in the second insulating layer and directly contacts the pixel electrode.

22. The organic light-emitting display apparatus of claim 20, wherein an end portion of the third contact layer protrudes from an etching surface of an opening formed in the third insulating layer and directly contacts the pixel electrode.

23. The organic light-emitting display apparatus of claim 20, wherein the pixel electrode contact unit further comprises a fourth contact layer disposed between the first insulating layer and the third insulating layer and comprising the same material as that of the gate electrode.

24. The organic light-emitting display apparatus of claim 1, wherein the opposing electrode comprises a reflective metal layer.

* * * * *